(12) United States Patent
Kaneta et al.

(10) Patent No.: US 8,772,762 B2
(45) Date of Patent: Jul. 8, 2014

(54) ORGANIC ELECTROLUMINESCENT DEVICE, METHOD FOR MANUFACTURING ORGANIC ELECTROLUMINESCENT DEVICE, IMAGE DISPLAY DEVICE, AND METHOD FOR MANUFACTURING IMAGE DISPLAY DEVICE

(75) Inventors: Shingo Kaneta, Kitakatsushika-gun (JP); Yuki Yasu, Kitakatsushika-gun (JP); Ryo Syoda, Kawaguchi (JP); Noriko Morikawa, Koshigaya (JP); Eiichi Kitazume, Saitama (JP)

(73) Assignee: Toppan Printing Co., Ltd., Tokyo (JP)

( * ) Notice: Subject to any disclaimer, the term of this patent is extended or adjusted under 35 U.S.C. 154(b) by 4 days.

(21) Appl. No.: 13/240,835

(22) Filed: Sep. 22, 2011

(65) Prior Publication Data

US 2012/0007067 A1    Jan. 12, 2012

Related U.S. Application Data

(63) Continuation of application No. PCT/JP2010/002127, filed on Mar. 25, 2010.

(30) Foreign Application Priority Data

Mar. 25, 2009 (JP) ............................. P2009-073551
Mar. 25, 2009 (JP) ............................. P2009-073567
Jul. 21, 2009 (JP) ............................. P2009-169849

(51) Int. Cl.
*H01L 51/52* (2006.01)

(52) U.S. Cl.
USPC .................. 257/40; 257/13; 257/88; 257/79; 257/E29.094; 257/E33.019; 257/E33.05; 257/E21.464; 257/E51.019; 438/34; 438/22; 313/504; 313/505; 313/506; 428/917; 427/66; 977/950

(58) Field of Classification Search
USPC .............. 257/13, 88; 313/503, 504, 505, 500; 29/846; 428/690; 438/87
See application file for complete search history.

(56) References Cited

U.S. PATENT DOCUMENTS

| 2006/0238111 | A1 | 10/2006 | Shimizu et al. | |
|---|---|---|---|---|
| 2007/0001589 | A1* | 1/2007 | Taguchi et al. | 313/504 |
| 2007/0241665 | A1* | 10/2007 | Sakanoue et al. | 313/503 |
| 2008/0124574 | A1* | 5/2008 | Shoda et al. | 428/690 |

FOREIGN PATENT DOCUMENTS

| JP | 9-63771 | 3/1997 |
|---|---|---|
| JP | 2851185 | 11/1998 |
| JP | 2916098 | 4/1999 |
| JP | 2001-93668 | 4/2001 |
| JP | 2001-155858 | 6/2001 |
| JP | 2006-302723 | 11/2006 |
| JP | 2009-009708 | 1/2009 |

OTHER PUBLICATIONS

International Search Report for PCT/JP2010/002127 mailed Jun. 15, 2010.

* cited by examiner

*Primary Examiner* — Jerome Jackson, Jr.
*Assistant Examiner* — Bo Fan

(57) ABSTRACT

Provided is an organic electroluminescent device including: a substrate (11, 101); a first electrode (12, 102) formed on the substrate (11, 101) and including a pixel region; a partition wall (23, 203) formed on the substrate (11, 101), partitioning the first electrode (12, 102), and including a surface with a recessed and projected form; a luminescent medium layer (19, 109) formed on the pixel region and the partition wall (23, 203), a film thickness of the partition wall (23, 203) being uneven according to the recessed and projected form; and a second electrode (17, 107) formed on the luminescent medium layer (19, 109).

7 Claims, 13 Drawing Sheets

ORGANIC ELECTROLUMINESCENT DEVICE, METHOD FOR MANUFACTURING ORGANIC ELECTROLUMINESCENT DEVICE, IMAGE DISPLAY DEVICE, AND METHOD FOR MANUFACTURING IMAGE DISPLAY DEVICE

CROSS REFERENCE TO RELATED APPLICATIONS

This application is a continuation application based on PCT Patent Application No. PCT/JP2010/002127, filed Mar. 25, 2010, whose priority is claimed on Japanese Patent Application No. 2009-073551, filed Mar. 25, 2009; Japanese Patent Application No. 2009-073567, filed Mar. 25, 2009; and Japanese Patent Application No. 2009-169849, filed Jul. 21, 2009; the entire contents of which are incorporated herein by reference.

BACKGROUND OF THE INVENTION

1. Field of the Invention

The present invention relates to an organic electroluminescent device, a method for manufacturing an organic electroluminescent device, an image display device, and a method for manufacturing an image display device.

2. Description of the Related Art

In recent years, an organic electroluminescent element (hereinafter referred to as an organic EL element) has been developed. The organic EL element is a luminescent element which can emit high-intensity light by a direct current low voltage driving. The organic EL element is configured in a simple manner. In particular, the organic EL element includes two electrodes and a hole transport layer or an organic luminescent layer. The two electrodes face one another. The hole transport layer includes a hole transport material provided between the two electrodes. The organic luminescent layer includes an organic luminescent material. According to this organic EL element, an electrical current is applied between the two electrodes. As a result, the organic luminescent layer emits light. This emitted light is taken out by an optically-transparent electrode.

According to the organic EL element structured as described above, a configuration is also possible in which both electrodes are placed at both sides of the luminescent layer. However, in order to achieve increased efficiency in emitting light, it is often the case that an injection layer or a transport layer is provided, or, alternatively, an injection layer and a transport layer are both provided. An example is a structure in which a hole injection layer or a hole transport layer is provided between an anode and a luminescent layer, or, alternatively, a hole injection layer and a hole transport layer are both provided between a positive electrode and a luminescent layer. Another example is a structure in which an electron injection layer or an electron transport layer is provided between a negative electrode and a luminescent layer. In the technical field of organic EL elements, a luminescent medium layer refers to the entire structural body including the plurality of film layers sandwiched between both electrodes.

In general, the type of organic EL elements is divided into two types according to the organic luminescent material used in the organic luminescent layer. The first type is an organic EL element using a low-molecular organic luminescent material (hereinafter referred to as a low-molecular organic EL element). The second type is an organic EL element using a polymer organic luminescent material (hereinafter referred to as a polymer organic EL element).

In general, according to a method of forming a low-molecular organic EL element, a thin film is formed using a dry coating method such as a vacuum deposition method and the like. According to such a method of forming a low-molecular organic EL element, when a patterning of the hole transport layer or the organic luminescent layer is necessary, a metal mask and the like is used to form a layer having a pattern according to an opening part of the mask. However, there is a problem with such a patterning method in that, as the area of the substrate increases, it becomes more difficult to obtain a desired level of precision in the patterning. In addition, since a film is formed in a vacuum, there is a problem in that a throughput is low. Furthermore, there is likely to be greater influence due to an irregular form included in a foundation part located below the hole transport layer or the organic luminescent layer. As a result, an unevenness may appear in an image shown by an image display device including the hole transport layer or the organic luminescent layer.

According to a method of forming a polymer organic LE element, a coating liquid is prepared such that an organic luminescent material is dissolved. Then, a wet coating method is used to apply a coating liquid on a substrate. In this way, a thin film is formed. Examples of the wet coating method for forming a thin film include a spin coating method, a bar coating method, a protrusion coating method, a deep coating method, and the like. However, when these wet coating methods are used, it is difficult to perform a patterning with a thin film at a high level of precision. It is also difficult to form a thin film by applying three colors including R, G, and B individually. Therefore, among the methods for forming a polymer organic EL element, it is believed to be most effective to use the printing method to form a thin film. The printing method allows a patterning to be performed while applying a plurality of materials individually.

In addition, when various types of printing methods are performed, a glass substrate is often used as the substrate for organic EL elements or displays. Therefore, a method using a hard block such as a metallic printing block, like the gravure printing method, is not suitable as a method for forming a polymer organic EL element. Meanwhile, the offset printing method, using an elastic rubber blanket, is suitable for forming a polymer organic EL element. In addition, the typography method, using a similarly elastic rubber plate or a photopolymer printing, is also suitable for forming a polymer organic EL element. In fact, as an attempt to use these printing methods, a method based on the offset printing method (Japanese Unexamined Patent Application, First Publication No. 2001-93668), a method based on typography (Japanese Unexamined Patent Application, First Publication No. 2001-155858), and the like are suggested.

According to a polymer organic EL element, a hole transport layer is provided to obtain an emission of light by applying a low voltage. A low-molecular organic material and a polymer organic material are normally used as the material used for this hole transport layer. This is similar to the case regarding the luminescent layer.

TPD (tri-phenylene-amin type derivative: see Japanese Patent No. 2916098) is known to be a representative example of a low-molecular hole transport material. A PEDOT:PSS (a compound of polythiophene and polystyrene sulfonic acid: see Japanese Patent No. 2851185) is known to be a representative example of a polymer hole transport material. A dry coating method or a wet coating method is used as the film forming method. This is similar to the case regarding the organic luminescent layer.

Incidentally, an attempt has also been made to use an inorganic material as the hole transport material (see Japanese Unexamined Patent Application, First Publication No. H9-63771). This Japanese Unexamined Patent Application, First Publication No. H9-63771 suggests that the durability of an organic EL element, using an organic compound such as the TPD or the PEDOT:PSS etc. as a hole transport material, is low. However, speaking of the luminescent characteristics of the organic EL element, an emission with a high degree of brightness and a high level of efficiency is obtained as an initial characteristic (hereinafter referred to as an initial characteristic). Thus, a driving with a direct current and a low voltage is achieved. However, the brightness or the efficiency declines due to the driving condition being continued or preserved for a long period of time. As a result, the luminescent characteristics are observed to decline.

The durability of the organic EL element is low because the heat resistant property of the thin film including TPD, which is a low molecular organic compound material, is low. The durability of the organic EL element is low also because the molecules within the non-crystallized thin film are altered due to the application of electrical current and becomes a microcrystallite, thereby reducing the functionality. Meanwhile, when a polymer material PEDOT:PSS is used, the functionality is believed to decrease because the ion element is scattered to the electrode or the organic luminescent layer and the like, when electric current is applied to the organic layer. The inorganic material includes a lot of material that has a superior heat resistance characteristics and has a high degree of electrochemical stability. Accordingly, this problem may be resolved by using an inorganic material as the hole transport material.

FIG. 20A is a diagram showing a structure of a general organic EL element. A first electrode 102 is formed on the substrate 101. A hole transport layer 104, an organic luminescent layer 106, and a second electrode 107 are stacked on the first electrode 102 in series. The hole transport layer is required to have heat resistance or electrochemical stability. Further, the hole transport layer is also required to have light permeability, a high work function, and resistance to the environment. However, the characteristic that is most required of the hole transport layer is to have a high degree of charge injection.

Work function, band gap, specific resistance, and the like affect the degree of charge injection. Each of these characteristics may be adjusted by selecting the inorganic material used as the hole transport layer. However, it is difficult to satisfy all of the characteristics that are required. Even if a material satisfying the required characteristics of work function and band gap is used, a problem occurs as described below, if the specific resistance is low.

FIG. 20B is a cross sectional view of a general organic EL display device. The layering structure of the organic EL element is similar to what is shown in FIG. 20A. However, in order to configure an image display device displaying three colors of RGB, a partition wall 203 is provided. The partition wall 203 partitions off pixels. A hole transport layer 104, an organic luminescent layer 106, and a second electrode 107 are formed so as to cover a first electrode 102 and the partition wall 203. In order to drive such an image display device, it is necessary to control the luminescence of each pixel.

According to an electroluminescence of a normal organic EL element, a hole is injected from a direction opposite to a surface at which a substrate contacts a first electrode. Then, the hole moves inside the hole transport layer so that the travel path of the hole is perpendicular to the first electrode. Furthermore, an electron injected from a negative electrode is recombined with a hole within the organic luminescent layer. In this way, emitted light is obtained.

In FIG. 20B, when the specific resistance in the film-thickness direction of the hole transport layer 104 is referred to as a perpendicular specific resistance, and when the specific resistance in the film-surface direction of the hole transport layer 104 (a direction horizontal to the surface of the hole transport layer 104) is referred to as a horizontal specific resistance, a normal electroluminescent light is obtained if the perpendicular specific resistance is lower than the horizontal specific resistance. However, when the perpendicular specific resistance is higher than the horizontal specific resistance, an electric current that does not contribute to the luminescent phenomenon (hereinafter referred to as a leak current) runs in the film-surface direction. The hole moves within the hole transport layer 104 formed on the partition wall 203. Thus, the characteristic of the organic EL element declines. Furthermore, according to an image display device configured with an organic EL element as described above, there is a problem in that, when a leak current runs between adjacent pixels, it becomes difficult to control the display in a desirable manner.

The present invention is made according to the problems described above. A first object of the present invention is to provide an organic electroluminescent device and a method for manufacturing an organic electroluminescent device, which can be easily manufactured and which can reduce or restrain a leak current. The organic electroluminescent device includes a predetermined luminescent medium layer formed on the entire display region. This display region includes the partition wall which partitions off pixels.

In addition, a second object of the present invention is to provide an organic electroluminescent device, an image display device, and a method for manufacturing an image display device. The organic electroluminescent device is configured so that an organic EL element is used. The organic EL element includes a hole transport layer using an inorganic material. Thus, a leak current in the film-surface direction of the hole transport layer is reduced. Furthermore, element characteristics are enhanced.

SUMMARY

In order to solve the problems described above, the following configurations are made.

An organic electroluminescent device according to a first aspect of the present invention includes: a substrate; a first electrode formed on the substrate and including a pixel region; a partition wall formed on the substrate, partitioning the first electrode, and including a surface with a recessed and projected form; a luminescent medium layer formed on the pixel region and the partition wall, a film thickness of the partition wall being uneven according to the recessed and projected form; and a second electrode formed on the luminescent medium layer.

According to the first aspect of the present invention, it is preferred that the luminescent medium layer formed on the partition wall is a hole transport layer.

According to the first aspect of the present invention, it is preferred that the hole transport layer is an inorganic compound.

According to the first aspect of the present invention, it is preferred that the inorganic compound includes one or more types of transition metal.

According to the first aspect of the present invention, it is preferred that the inorganic compound is an oxide, a nitride, or a sulfide.

According to the first aspect of the present invention, it is preferred that a film thickness of the inorganic compound is greater than or equal to 1 nm and less than or equal to 50 nm.

According to the first aspect of the present invention, it is preferred that an average interval between a projected portion of a surface of the recessed and projected form is greater than or equal to 1 nm and less than or equal to 100 nm.

According to the first aspect of the present invention, it is preferred that the luminescent medium layer formed on the partition wall is a recessed and projected film formed according to the recessed and projected form.

Incidentally, a method for manufacturing an organic electroluminescent device according to a second aspect of the present invention includes the steps of: preparing a substrate; forming a first electrode on the substrate, the first electrode including a pixel region; forming a partition wall on the substrate, the partition wall partitioning the first electrode and including a surface with a recessed and projected form; forming at least one part of a luminescent medium layer on the pixel region and the partition wall using a dry film formation method; and forming a second electrode on the luminescent medium layer.

According to the second aspect of the present invention, it is preferred that the recessed and projected form is provided by performing a plasma processing on the surface of the partition wall.

According to the second aspect of the present invention, it is preferred that an introduction gas supplied to a chamber and used for the plasma processing is one type of a gas or two or more types of a compound gas selected from an argon, an oxygen, a nitrogen, a helium, a fluorine, and a hydrogen.

According to the second aspect of the present invention, it is preferred that during the plasma processing, a plasma including an oxygen is irradiated to the surface of the partition wall at an electric power of greater than or equal to 50 W and less than or equal to 300 W.

Incidentally, an organic electroluminescent device according to a third aspect of the present invention includes: a substrate; a first electrode formed on the substrate; a second electrode formed opposite to the first electrode; a luminescent medium layer sandwiched between the first electrode and the second electrode, the luminescent medium layer including an organic luminescent layer and a hole transport layer including at least an inorganic compound; and a discontinuous island-like part including the hole transport layer.

According to the third aspect of the present invention, it is preferred that the organic electroluminescent device further include a partition wall partitioning the first electrode into a plurality of pixels, wherein the hole transport layer is formed on the first electrode and the partition wall; and the hole transport layer is included in the island-like part formed on at least the first electrode or the partition wall.

According to the third aspect of the present invention, it is preferred that the inorganic compound includes one or more types of transition metal.

According to the third aspect of the present invention, it is preferred that the inorganic compound is an oxide, a nitride, or a sulfide.

According to the third aspect of the present invention, it is preferred that an average light permeability of the inorganic compound in an optical wavelength region is greater than or equal to 75%.

According to the third aspect of the present invention, it is preferred that a film thickness of the inorganic compound is greater than or equal to 0.5 nm and less than or equal to 20 nm.

According to the third aspect of the present invention, it is preferred that the hole transport layer is included in the island-like part formed on the first electrode.

According to the third aspect of the present invention, it is preferred that the hole transport layer is included in the island-like part formed on the partition wall.

According to the third aspect of the present invention, it is preferred that the first electrode is transparent; the hole transport layer is formed above the first electrode and between the first electrode and the second electrode; and the organic luminescent layer is formed above the hole transport layer.

According to the third aspect of the present invention, it is preferred that the second electrode is transparent; the hole transport layer is formed above the first electrode between the first electrode and the second electrode; and the organic luminescent layer is formed above the hole transport layer.

Incidentally, an image display device according to a fourth aspect of the present invention includes the organic electroluminescent element used as a display element.

Incidentally, a method for manufacturing an organic electroluminescent device according to a fifth aspect of the present invention includes the steps of: preparing a substrate; forming a first electrode on the substrate; forming a hole transport layer on the first electrode, the hole transport layer including an inorganic compound and including a discontinuous island-like part; forming a buffer layer on the hole transport layer using a wet film formation method; forming an organic luminescent layer on the buffer layer; and forming a second electrode opposing the first electrode.

According to the fifth aspect of the present invention, it is preferred that a partition wall, partitioning the first electrode into a plurality of pixels, is formed; and the hole transport layer is formed on the first electrode and the partition wall.

According to the fifth aspect of the present invention, it is preferred that the inorganic compound included in the hole transport layer an oxide, a nitride, or a sulfide, including one or more type of a transition metal; and a film thickness of the inorganic compound is greater than or equal to 0.5 nm and less than or equal to 20 nm.

According to the fifth aspect of the present invention, it is preferred that the buffer layer is an interlayer.

According to the fifth aspect of the present invention, it is preferred that the organic luminescent layer is formed using a wet film formation method.

According to the fifth aspect of the present invention, it is preferred that the organic luminescent layer is formed using a printing method.

According to the fifth aspect of the present invention, it is preferred that the first electrode is transparent; the hole transport layer is formed above the first electrode and between the first electrode and the second electrode; and the organic luminescent layer is formed above the hole transport layer.

According to the fifth aspect of the present invention, it is preferred that the second electrode is transparent; the hole transport layer is formed above the first electrode and between the first electrode and the second electrode; and the organic luminescent layer is formed above the hole transport layer.

Incidentally, a method for manufacturing an image display device according to a sixth aspect of the present invention forms a display element using the above method for manufacturing an organic electroluminescent device.

According to the first and second embodiments of the present invention, a recessed and projected shape is formed on the surface of a partition wall. As a result, even if a luminescent medium layer is formed on the entire surface of the display region, a displaying abnormality due to a leak current does not occur. In this way, it is possible to manufacture an EL device having good EL characteristics as well.

According to the third and fourth embodiments of the present invention, the hole transport layer is formed in the form of a thin film. Thus, a discontinuous island-like part is formed by the hole transport layer. In other words, the hole transport layer includes an island-like structure. According to this structure, the electric charge transport characteristic in the film-surface direction becomes lower than the electric charge transport characteristic in the film-thickness direction. As a result, it is possible to restrain the electron injected from the electrode to become a leak current. Therefore, since the hole transport layer includes an island-like structure, it is possible to use a lot of inorganic material as the hole transport material, regardless of the value of the specific resistance.

According to the present invention, a "film-surface direction" refers to a direction parallel to a direction in which a layer extends. In other words, the "film-surface direction" refers to a direction in which a hole transport layer (luminescent medium layer) extends. For example, when the hole transport layer (luminescent medium layer) is formed along a flat surface such as a first electrode, the "film-surface direction" refers to a direction along the flat surface. Meanwhile, if the hole transport layer (luminescent medium layer) is formed along a curved surface formed on a partition wall, the "film-surface direction" refers to a direction along the curved surface.

The most appropriate film thickness of the hole transport layer with an island-like structure differs according to the type of the inorganic material. However, a film thickness of greater than or equal to 0.5 nm and less than or equal to 20 nm is appropriate. When the film thickness exceeds 20 nm, it becomes difficult to form a hole transport layer with an island-like structure. As a result, when an inorganic material having a low specific resistance is used, a leak current is more likely to occur.

In addition, it is possible to obtain the work function required of the hole transport material of the organic EL by using an inorganic compound including one or more types of transition metal as the hole transfer material, use an oxide, a sulfide, or a nitride as the inorganic compound, and by forming a single layer, a stacked layer, or a compound layer including these materials.

In addition, it is possible to obtain a light permeability characteristic required of a hole transport material of an organic EL element by using an inorganic compound including one or more types of transition metal as the hole transfer material, use an oxide, a sulfide, or a nitride as the inorganic compound, forming a single layer, a stacked layer, or a compound layer including these materials, and by forming an island-like structure having a film-thickness of greater than or equal to 0.5 nm and less than or equal to 20 nm.

Incidentally, it is not necessary to provide a discontinuous island-like part (island-like structure) to the entire surface of the hole transport layer. The island-like structure may be provided only at one portion. For example, the island-like structure may be provided only on the partition wall. As another example, the island-like structure may be provided only on the electrode. As a result, it is possible to use a lot of material as the electrode material, partition wall material, and the hole transport material.

According to the fifth and sixth embodiments of the present invention, the hole transport layer is formed in a thin-film structure. Furthermore, a discontinuous island-like part is provided. The discontinuous island-like part includes the hole transport layer. In other words, the hole transport layered in an island-like manner. According to this structure, the electric charge transport characteristic in the film-surface direction becomes lower than the electric charge transport characteristic in the film-width direction. As a result, it is possible to prevent the electric charge, injected from the electrode, from being a leak current.

Furthermore, a luminescent medium layer is formed using a wet type film forming method. As a result, the luminescent medium layer placed on the island-like part is prevented from being formed in an uneven manner. Thus, the surface of the luminescent medium layer becomes smoother. In this way, it is possible to obtain an even film surface. Therefore, it is possible to obtain a luminescence from a luminescent medium layer having an even film surface. In addition, it is possible to reduce the unevenness in luminescence.

The most appropriate film thickness of the hole transport layer with an island-like structure differs according to the type of the inorganic material. However, a film thickness of greater than or equal to 0.5 nm and less than or equal to 20 nm is appropriate. When the film thickness exceeds 20 nm, it becomes difficult to form a hole transport layer with an island-like structure. As a result, when an inorganic material having a low specific resistance is used, a leak current is more likely to occur.

In addition, it is possible to obtain the work function required of the hole transport material of the organic EL by using an inorganic compound including one or more types of transition metal as the hole transfer material, use an oxide, a sulfide, or a nitride as the inorganic compound, and by forming a single layer, a stacked layer, or a compound layer including these materials.

In addition, it is possible to obtain a light permeability characteristic required of a hole transport material of an organic EL element by using an inorganic compound including one or more types of transition metal as the hole transfer material, use an oxide, a sulfide, or a nitride as the inorganic compound, forming a single layer, a stacked layer, or a compound layer including these materials, and by forming an island-like structure having a film-thickness of greater than or equal to 0.5 nm and less than or equal to 20 nm.

Incidentally, it is not necessary to provide a discontinuous island-like part (island-like structure) to the entire surface of the hole transport layer. The island-like structure may be provided only at one portion. For example, the island-like structure may be provided only on the partition wall. As another example, the island-like structure may be provided only on the electrode. As a result, it is possible to use a lot of material as the electrode material, partition wall material, and the hole transport material.

BRIEF DESCRIPTION OF THE DRAWINGS

FIG. 6A is a diagram showing a structure such that a first layer of luminescent medium layer from a first electrode is formed a partition wall.

FIG. 6B is a diagram showing a structure such that a second layer of luminescent medium layer from a first electrode is formed a partition wall.

DETAILED DESCRIPTION OF THE PREFERRED EMBODIMENTS

Hereinafter, embodiments of the present invention are described with reference to the attached diagrams.

Incidentally, in each of the diagrams used in the following description, the dimensions and ratios of each component are differed from the actual dimensions and ratios so that each component may be large enough to be recognized in the diagram.

First Embodiment

Figure 1:
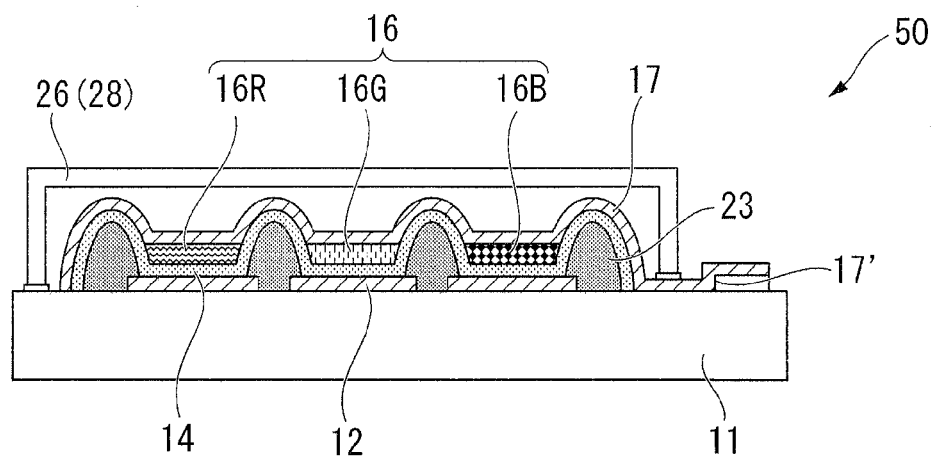
FIG. 1 is a schematic cross sectional diagram of an organic EL display device according to a first embodiment of the present invention.

FIG. 1 is a cross sectional diagram showing a configuration of an organic EL display device (organic electroluminescent device) according to a first embodiment of the present invention.

FIG. 1 shows a display device 50 using an organic EL element according to a first embodiment of the present invention. The display device 50 includes a substrate 11, a first electrode (positive electrode, pixel electrode) 12, a partition wall 23, a hole transport layer 14, an organic luminescent layer 16, a second electrode (negative electrode) 17, a luminescent medium layer 19 (see FIG. 4A), and a sealing body 28. The first electrode 12 is provided on each pixel on the substrate 11. The partition wall 23 partitions between pixels of the first electrode 12. The hole transport layer 14 is formed above the first electrode 12. The organic luminescent layer 16 is formed on the hole transport layer. The second electrode 17 is formed so as to cover the entire surface of the luminescent layer. The luminescent medium layer 19 includes the first electrode 12, the partition wall 23, the hole transport layer 14, and the organic luminescent layer 16. The sealing body 28 contacts the substrate 11 so as to cover the second electrode 17.

The sealing body 28 is structured so that a sealing cap 26 is used. The sealing cap 26 covers the organic EL element as shown in FIG. 1. An inactive gas is enclosed inside the sealing cap 26.

Figure 2:
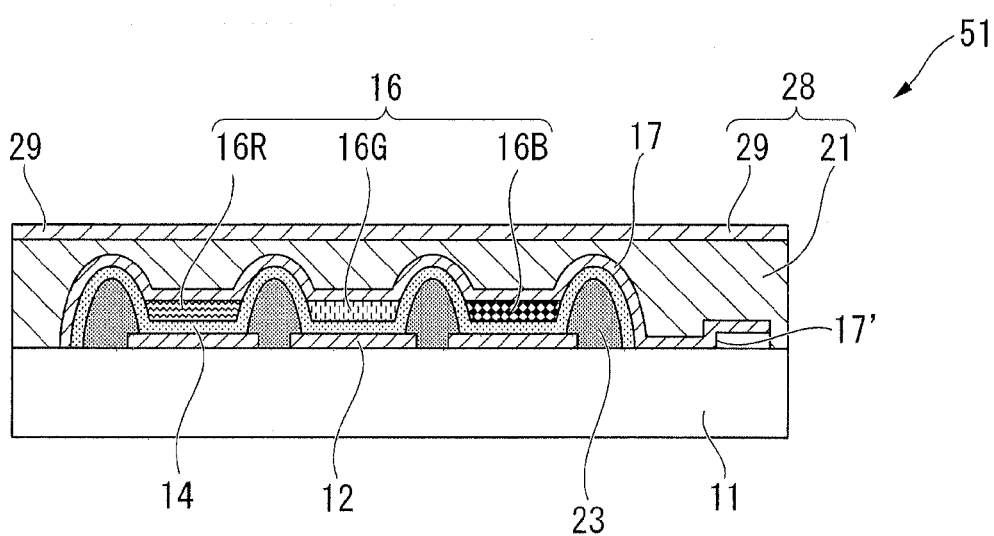
FIG. 2 is a schematic cross sectional diagram of an organic EL display device according to a first embodiment of the present invention.

FIG. 2 is a cross sectional diagram showing a structure of an organic EL display device according to a first embodiment of the present invention.

FIG. 2 shows a display device 51 using an organic EL element according to a first embodiment of the present invention. The display device 51 includes an electrode, a layer, and a partition wall shown in FIG. 1. The display device 51 is configured so that a resin layer 21 is provided so as to cover the second electrode 17. A sealing plate 29 is attached to the substrate 11 via the resin layer 21. According to FIG. 2, the sealing body 28 is structured by the resin layer 21 and the sealing plate 29.

According to FIGS. 1 and 2, a switching element (thin film transistor) is connected to a first electrode (not diagrammed). The switching element controls each pixel.

Figure 3:
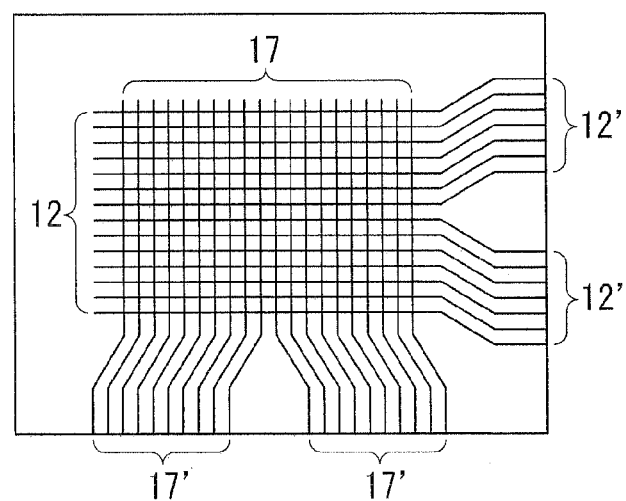
FIG. 3 is a schematic planar diagram showing a structure of an electrode of a passive type organic EL display device.

FIG. 3 is a schematic planar view showing a structure of an electrode of a passive type organic EL display device.

According to a first embodiment of the present invention, a first electrode 12 in striped form and a second electrode 17 in striped form may intersect with each other. Furthermore, a luminescent medium layer 19 may be provided between the first electrode 12 and the second electrode 17. In other words, a configuration of the present invention may be applied to a passive matrix type organic EL display device in which a pixel positioned at an intersecting portion is illuminated.

In the following description, a region at which the luminescent medium layer is sandwiched between the first electrode 12 and the second electrode 17 is referred to as a luminescent region or an organic EL element. An entire array of the organic EL element including the partition wall 23 is referred to as a display region.

In FIGS. 1-3, the luminescent medium layer 19 is a layer sandwiched between the first electrode (positive electrode) 12 and the second electrode (negative electrode) 17. In the structure shown in FIG. 1, the hole transport layer 14 and the organic luminescent layer 16 correspond to the luminescent medium layer 19. Other than these components, layers such as the hole injection layer, the electron transport layer, and the electron injection layer may be added as well. A layer is a luminescent medium layer as long is the layer is placed between electrodes, and the layer transports a carrier (hole, electron) between the electrodes.

For example, according to the structure shown in FIG. 1, the luminescent medium layer 19 includes two layers: the hole transport layer 14 and the organic luminescent layer 16 stacked on the transparent electrode (positive electrode) 12 in this order. However, the luminescent medium layer 19 may be structured with two layers: the hole injection layer and the organic luminescent layer 16. In a different configuration, the luminescent medium layer 19 may include three layers: the hole injection layer, the hole transport layer 14, and the organic luminescent layer 16, stacked in this series. Furthermore, one layer may possess various characteristics of these plurality of layers. For instance, the luminescent medium layer 19 may be configured so that the organic luminescent layer 16 has a characteristic of carrying a hole. Furthermore, the luminescent medium layer 19 may include the positive injection layer and the electron transport layer, wherein an illumination is made at a boundary surface between the hole injection layer and the electron transport layer.

The thickness of the entire luminescent medium layer 19 is less than or equal to 1000 nm, regardless of whether the luminescent medium layer 19 is structured with a single layer of a luminescent layer, or whether the luminescent medium layer 19 is structured with multiple layers. The thickness of the entire luminescent medium layer 19 is preferably 50 to 300 nm.

According to the organic EL display device shown in FIGS. 1 and 2, a patterned organic luminescent layer 16R, 16G, and 16B are formed for each patterned electrode. The organic luminescent layer 16R, 16G, and 16B are patterned so that each of the organic luminescent layer 16R, 16G and 16B correspond respectively to the luminescent wave length of red (R), green (G), and blue (B). In this way, a display panel may be obtained, which can exhibit a display in full color. As a different display method, it is possible to use a color conversion method using a blue luminescent layer and a color conversion layer. A configuration is also possible in which a color filter is provided corresponding to each of a plurality of organic EL elements emitting a white light.

Figure 4A:
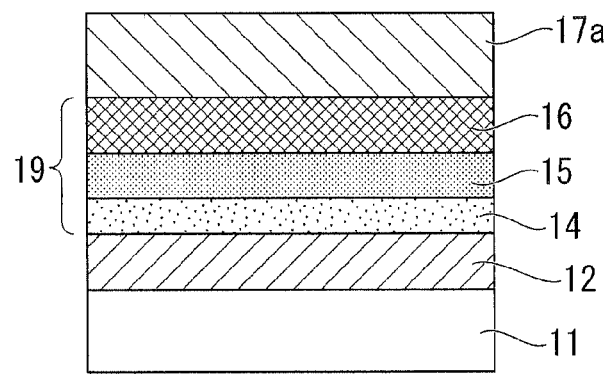
FIG. 4A is a schematic cross sectional diagram showing a stacked layer structure of an organic EL element according to a first embodiment of the present invention, for example, a bottom emission type organic EL element.
Figure 4B:
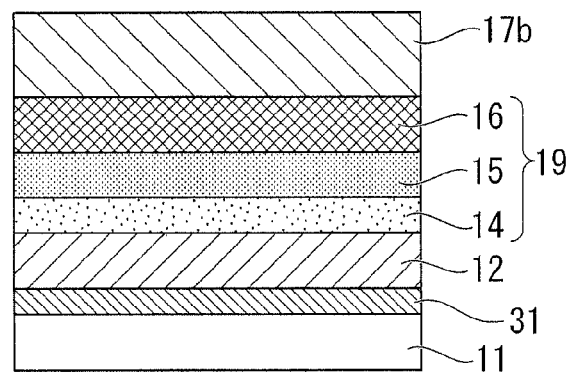
FIG. 4B is a schematic cross sectional diagram showing a stacked layer structure of an organic EL element according to a first embodiment of the present invention, for example, a top emission type organic EL element.

FIGS. 4A and 4B are cross sectional diagrams showing a stacked layer portion, i.e., a luminescent region of an organic EL element according to the present invention.

FIG. 4A shows a bottom emission type organic electroluminescent element. FIG. 4A shows a structure in which the first electrode 12, the luminescent medium layer 19, and the second electrode 17a are stacked on the substrate 11 in this order. According to a luminescent medium layer 19 in which the first electrode 12, the luminescent medium layer 19, and the second electrode 17a are stacked in this order, an inter layer 15 or another luminescent medium layer may be placed between each layer other than the hole transport layer 14 and the organic luminescent layer 16. The second electrode 17a is a light impermeant electrode. A material having a high reflection rate, such as metal and the like, is used as the material for the second electrode 17a. In this way, light, emitted towards the second electrode 17a, is reflected at the second electrode 17a. Further, the emitted light may be ejected outside the organic EL element through the first electrode 12, which is an optically-transparent electrode. In this way, it is possible to enhance the efficiency of extracting light.

FIG. 4B shows a top emission type organic EL element. A reflection layer 31, a first electrode 12, a hole transport layer 14, an interlayer 15, an organic luminescent layer 16, and a second electrode are stacked on the substrate 11 in this order. According to this structure of the organic EL element such that these layers are stacked in this order, another layer may be placed between a plurality of layers. The second electrode 17b is an optically-transparent electrode. Light emitted towards the first electrode 12 passes through the first electrode 12 and is reflected at the reflection layer. This light is emitted outside the organic EL element through the second electrode 17b. Meanwhile, light emitted towards the second electrode 17b similarly passes through the second electrode 17b, and is emitted outside the organic EL element.

In the following description, the present embodiment is described with a bottom emission type organic electroluminescent element being given as an example. However, it is possible to apply the configuration of the present embodiment to a top emission type organic electroluminescent element using a transparent conductive film as the material for the second electrode 17b.

Figure 5:
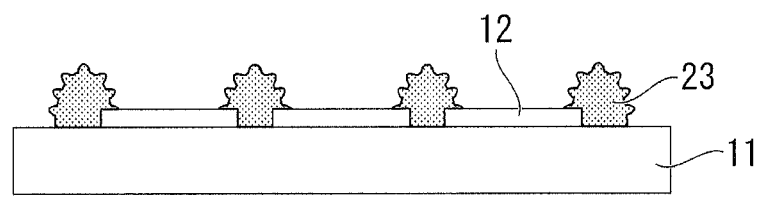
FIG. 5 is a schematic cross sectional diagram showing a partition wall applied with a surface processing to form a recessed and projected shape according to a first embodiment of the present invention.

According to the organic EL display device based on the present invention, a minute recessed and projected shape is provided at a surface of the partition wall 23 as shown in FIG. 5. This recessed and projected shape is provided on the partition wall 23 by applying a predetermined surface processing on the partition wall 23.

Figure 7:
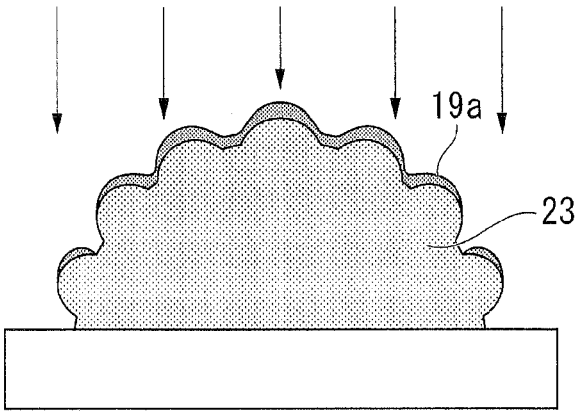
FIG. 7 is a schematic diagram showing a film formation process of a luminescent medium layer according to a first embodiment of the present invention.

As described later, a predetermined luminescent medium layer is provided on this partition wall 23. As a result, a luminescent medium layer is formed along the recessed and projected shape. Thus, a recessed and projected film including a luminescent medium layer is formed. As a result, the film thickness of the luminescent medium layer becomes uneven. Further, the luminescent medium layer is partially severed according to the recessed and projected shape. As a result, a hole part is partially formed on the luminescent medium layer. Therefore, the specific resistance of the luminescent medium layer in the film-surface direction increases. Hence, even if the luminescent medium layer is formed on the entire surface of the substrate 11, it is possible to restrain a leak current passing through the luminescent medium layer formed on the surface of the partition wall 23. Incidentally, a state of "the film thickness of the luminescent medium layer [being] uneven" refers to a state in which the film thickness of a part of the luminescent medium layer formed on the partition wall 23 is extremely thin. The state of "the film thickness of the luminescent medium layer [being] uneven" also refers to a state in which the luminescent medium layer is distributed discontinuously in the cross section of the partition wall 23, as shown in FIG. 7. In addition, the luminescent medium layer formed along the recessed and projected shape of the partition wall 23 is formed on each of the recessed part and the projected part of the partition wall 23. The luminescent medium layer, formed in this way, includes a recessed and projected shape. Therefore, the state of "the film thickness of the luminescent medium layer [being] uneven" also refers to a state in which the luminescent medium layer is partially insulated due to a step difference between the recessed portion and the projected portion. Further, a luminescent medium layer formed on the recessed portion is connected to a luminescent medium layer formed on the projected portion via a minute step difference part. In this way, the film thickness of the luminescent medium layer formed along the recessed and projected shape is smaller than the film thickness of a luminescent medium layer formed along the flat surface. Hence, there is an increase in the specific resistance in the film surface direction of the luminescent medium layer formed along the recessed and projected shape.

In addition, as described below, when the luminescent medium layer is formed on the partition wall 23 using a vapor phase film forming method such as the vapor deposition method and the like, the ingredients of the luminescent medium layer is provided on an exposed part, which is exposed to an evaporation source. Thus, a film is formed. However, a film is not formed on a portion that is not exposed to the evaporation source, such as a shadow part created due to the step difference part. In particular, when the ingredient of the luminescent medium layer is provided to the surface of the partition wall 23 being tilted in a diagonal direction with respect to the horizontal direction of the substrate 11, thus forming a film, the ingredient of the luminescent medium layer does not reach the shadow part created due to the step difference part. Therefore, the luminescent medium layer formed on the partition wall 23 is partially severed due to the step difference part.

Incidentally, among the luminescent medium layer formed on the partition wall 23, not all of the luminescent medium layer is severed by the step difference part. As described above, even when a step difference part is formed on the partition wall 23, a luminescent medium layer is also formed on the surface of the partition wall 23 such that the luminescent medium layer formed on the recessed portion is partially electrically connected to the luminescent medium layer formed on the projected portion. However, the conductivity of the luminescent medium layer formed on the step difference part is lower than the conductivity of the luminescent medium layer formed on another part. Consequently, there is an increase in the specific resistance in the film surface direction of the luminescent medium layer formed along the recessed and projected shape.

Figure 6A:
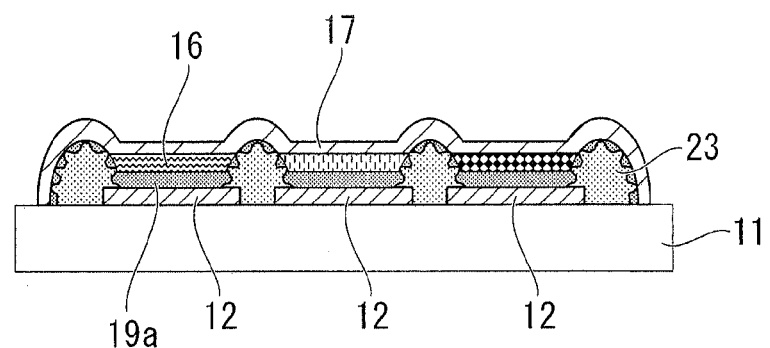
FIG. 6A is a schematic cross sectional diagram illustrating a part of an organic EL display device according to a first embodiment of the present invention.
Figure 6B:
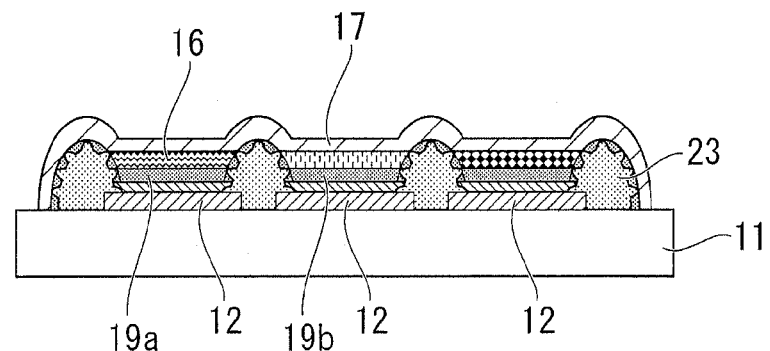
FIG. 6B is a schematic cross sectional diagram illustrating a part of an organic EL display device according to a first embodiment of the present invention.

It is preferable that the luminescent medium layer 19a formed on the partition wall 23 including a recessed and projected shape be a layer positioned between the first electrode 12 and the organic luminescent layer 16. For example, when the first electrode is a positive electrode, the luminescent medium layer 19a is an intermediate layer such as a hole transport layer, a hole injection layer, or an electron block layer and the like. As in FIG. 6A, when the luminescent medium layer 19a is formed on the entire surface of the display region as a first layer on the first electrode 12, it is preferred that the luminescent medium layer 19a be formed directly on the partition wall 23. Further, as in FIG. 6B, a configuration is also possible in which a luminescent medium layer 19b, being the first layer, is formed by performing a patterning on the pixel region, so as to correspond to the pixel region of the first electrode 12. According to this configuration, a luminescent medium layer 19b, being a second and later layer of luminescent medium layer positioned on the entire surface of the substrate 11, is formed on the surface of the partition wall 23.

When the luminescent medium layer 19a is formed on the surface of the partition wall 23 using a dry process, the average film thickness of the luminescent medium layer 19a on the luminescent region (hereinafter referred to as the thickness of the film being formed, or more simply, a film thickness) is preferably greater than or equal to 1 nm and is less than or equal to 50 nm, more preferably less than or equal to 30 nm. When the film thickness is less than 1 nm, the characteristic of the luminescent medium layer 19a as a functional thin film cannot be obtained. Thus, the luminescent intensity of the EL element declines. Meanwhile, when the film thickness of the luminescent medium layer 19a is greater than 50 nm, the film thickness of the luminescent medium layer 19a formed continuously on the surface of the partition wall 23 increases. As a result, the luminescent medium layer 19a cannot be formed in an intermissive manner on the surface of the partition wall 23. Consequently, the effect of restraining a leak current cannot be adequately obtained.

Incidentally, the inorganic material formed using a physical deposition method such as a sputtering method or a resistance heating vapor deposition method leads to a formation of a film depending on the condition of the surface at which the film is formed. When the thickness of the inorganic material is extremely small being less than or equal to 1 nm, the inorganic material is formed in an island manner even if the substrate is flat. Thus, there are cases in which a discontinuous film is obtained by the inorganic material.

Meanwhile, according to the present invention, the following effects are obtained by forming a recessed and projected shape on the surface of the partition wall 23.

(1) The surface area of the partition wall 23 becomes large. As a result, the substantive film thickness of the luminescent medium layer formed on the surface of the partition wall 23 may be reduced.

(2) By forming the luminescent medium layer along the recessed and projected shape of the partition wall 23, it is possible to deposit a luminescent medium layer with uneven film thickness on the partition wall 23. As a result, the luminescent medium layer may be grown while maintaining the discontinuous nature of the film.

Since these effects can be obtained by the present embodiment, it is possible to form on the surface of the partition wall 23, a film having a greater amount of film thickness and having increased electric resistance. Furthermore, as shown in FIG. 7, according to the film forming process depositing a film on the substrate 11 evenly in the perpendicular direction, the luminescent medium layer 9a may be formed more easily in an uneven manner on the recessed and projected surface (surface) of the partitioned wall 23. Therefore, the above effect may be obtained in a favorable manner.

It is preferred that the calculated surface roughness Ra of the recessed and projected surface of the partition wall 23 is larger than the average film thickness D of the luminescent medium layer 19a on the luminescent region. However, considering the effects described above, when the film thickness D of the luminescent medium layer 19a is less than or equal to 15 nm, i.e., when the value of the surface roughness of the partition wall 23 is smaller than the thickness of the film that is formed, it is believed that the discontinuous nature of the film is obtained. When an inorganic material is used as an ingredient of the luminescent medium layer, its specific resistance is small in general. Therefore, the effects of the present invention may be obtained in an efficient manner. By forming the luminescent medium layer 19*a* on the surface of the partition wall 23 discontinuously (intermittently) as described above, the film thickness of the luminescent medium layer 19*a* becomes thin at a portion of the partition wall 23. As a result, it is possible to increase the resistance of the luminescent medium layer 19*a* on the partition wall 23.

Incidentally, the calculated surface roughness Ra may be measured using a stylus type profilometer, for example. However, when the recessed and projected shape is formed using a plasma irradiation, as described later, a minute and steep recessed and projected shape is formed. Therefore, the value depends on the thickness of the probing needle. Therefore, the actual surface roughness may in some cases be 10 times larger than the measured value. When a measurement cannot be made accurately in this way, the average interval between the projected portions of the recessed and projected surface of the partition wall 23 may be measured. When the recessed and projected parts are formed by etching and the like, the smaller the interval is between adjacent projected parts, the steeper the obtained recessed and projected portions becomes (having a high aspect ratio). According to the present invention, the average interval between adjacent projected portions is 5-100 nm, more preferably, 15-50 nm. When the average interval between adjacent projected portions is smaller than 5 nm, there is a decrease in the film thickness of the luminescent medium layer 9*a* which may be formed in a discontinuous or uneven manner. Thus, the efficiency of illumination declines. Meanwhile, when the average interval between adjacent projected portions exceeds 100 nm, the recessed and projected shape becomes smooth. Thus, there is a possibility that the luminescent medium layer 19*a* cannot be formed in a discontinuous or uneven manner. The average interval between adjacent projected parts on the surface of the partition wall 23 may be computed, for example, from a picture which is photographed using an SEM (Scanning Electron Microscope).

Next, each component of the present invention and a method for manufacture is described in a case in which a hole transport layer is used as a luminescent medium layer 19*a* formed on the partition wall 23. Further, according to this method for manufacture, a method of forming a luminescent layer on the entire surface of the substrate 11 is not used as the method for forming a luminescent layer. Instead, a method of forming a luminescent layer by placing an ingredient of the luminescent layer on each pixel region is used.

Incidentally, the present invention is not limited to this configuration. A layer other than a hole transport layer may be formed on the surface of the partition wall 23 as the luminescent medium layer 19*a*. On the other hand, a configuration not including the luminescent layer may be applied. Further, a method that does not place the ingredient on each pixel region may be applied.

According to the first embodiment, the luminescent medium layer 19 includes a hole transport layer 14 and an organic luminescent layer 16. At least one layer among the luminescent medium layers 19 having such a configuration is formed on the pixel region and the partition wall.

Hereinafter, a concrete ingredient and a method of formation used for the organic EL element according to the first embodiment is described.

Examples of the ingredient of the substrate 11 include a plastic film or a sheet of glass, quartz, polypropylene, polyethersulfone, polycarbonate, cycloolefin polymer, poly arylate, polyamide, polymethylmethacrylate, polyethylene terephthalate, polyethylene naphthalate, and the like. In addition to these ingredients, in the case of a top emission type organic electroluminescent element, a light transmissive substrate may be used. This light transmissive substrate is obtained by stacking a single layer or multiple layers on the plastic film or the sheet mentioned above. Examples of the single layer or multiple layers that are stacked onto the plastic film or the sheet include a metallic oxide such as silicium oxide and aluminum oxide, metallic fluoride such as aluminum fluoride and magnesium fluoride, metallic nitride such as silicium nitride and aluminum nitride, metal oxynitride such as silicium oxynitride, polymer-resin film such as acrylic resin, epoxy resin, silicone resin, polyester resin, and the like. Furthermore, a light non-transmissive substrate may be used. This light non-transmissive substrate is obtained by stacking a metallic film on a metallic foil of aluminum and stainless-steel and the like, a sheet, a plate, a plastic film or a plastic sheet. Examples of the metallic film that are stacked include an aluminum, copper, nickel, stainless-steel, and the like. The present invention is not limited to the configurations described above. Other ingredient(s) may be used.

In a case in which the organic EL display device 50 is a bottom emission type, the emitted light generated by the luminescent medium layer is ejected outside the organic EL display device 50 through the first electrode 12 adjacent to the substrate 11. Meanwhile, in the case of a top emission type, the emitted light is ejected through a second electrode 16 facing the substrate 11. According to the substrate 11 including the ingredients described above, it is preferred that an anti-moisture processing or a hydrophobic processing be already performed on the entire surface of the substrate 11 or one surface of the substrate 11 so that water and oxygen are prevented from entering the organic EL display device 50. Examples of the anti-moisture processing and the hydrophobic processing include forming an inorganic film or applying a resin on the entire surface of the substrate 11 or one surface of the substrate 11. In particular, in order to prevent water from entering the luminescent medium layer 19, it is preferable that the moisture content, moisture vapor transmission rate, and gas permeability coefficient of the substrate 11 is small.

The first electrode 12 according to the first embodiment of the present invention is formed on the substrate 11. The first electrode 12 is formed by patterning according to necessity. The first electrode 12 is partitioned by the partition wall 23. The first electrode 12 is a pixel electrode corresponding to each pixel (sub pixel).

Examples of the ingredient of the first electrode 12 include a metallic composite oxide such as ITO (indium stannum composite oxide), IZO (indium zinc composite oxide), and AZO (zinc aluminum composite oxide); a metallic material such as gold and platinum, and a fine particle scattering film obtained by scattering the fine particles of these metallic oxide and metallic materials described above into epoxy resin, acrylic resin, and the like. Furthermore, the first electrode 12 is configured to be a single layered structure or a laminated structure. Meanwhile, the first electrode 12 may be formed by applying a precursor of octylic acid indium or an acetone indium and the like to the substrate, then forming an oxide by coating thermal heat decomposition method and the like.

When the first electrode 12 is a positive electrode, it is preferred to select a material such as ITO having a high work function. In the case of an organic electroluminescent display device driven with an active matrix, it is preferred that the material for the first electrode 12 has a low resistance. For example, a material having a sheet resistance of less than or equal to 20Ω·sq may be suitably used as the material for the first electrode 12.

The first electrode 12 may be formed using a traditional film forming method such as a dry film formation method or a wet film formation method according to the material of the first electrode 12. Examples of the dry film formation method include a resistance heating vapor deposition method, an electron beam vapor deposition method, a reactive vapor deposition method, an ion plating method, and a sputtering method. Examples of the wet film formation method include an ink jet printing method, a gravure printing method, and a screen printing method. The present invention is not limited to the above configuration. Another method may be used. Incidentally, an extraction electrode (not diagrammed) formed around the substrate 11 and connected to the first electrode 12 may be formed in the same procedure and with the same material.

As a patterning method for the first electrode 12, a conventional patterning method is used according to the ingredient or the film formation method. Examples of such a patterning method include a mask vapor deposition method, a photolithography method, a wet etching method, a dry etching method, and the like. Furthermore, the surface of the first electrode 12 may be activated using an UV processing, a plasma processing, and the like if necessary.

In the case of a top emission type, it is preferred that the reflection layer 31 (see FIGS. 4A and 4B) be formed at a lower part of the first electrode 12. It is preferred that a material with a high reflection rate be used as the ingredient for the reflection layer. For example, Cr, Mo, Al, Ag, Ta, Cu, Ti, and Ni may be used. In addition, the reflection layer is structured so that a protection film is formed on a single film including one or more types of the above ingredients, a laminated film, an alloy film, or a film including the above ingredients. Examples of the protection film include SiO, $SiO_2$, $TiO_2$, and the like. It is preferred that the reflection rate be greater than or equal to an average of 80% for the entire optical wavelength region. If the reflection rate is greater than or equal to 90%, the reflection layer may be used in a suitable manner.

The reflection layer may be formed using a traditional film forming method such as a dry film formation method or a wet film formation method according to the material of the reflection layer. Examples of the dry film formation method include a resistance heating vapor deposition method, an electron beam vapor deposition method, a reactive vapor deposition method, an ion plating method, and a sputtering method. Examples of the wet film formation method include an ink jet printing method, a gravure printing method, and a screen printing method. The present invention is not limited to the above configuration. Another method may be used.

As a patterning method for the reflection layer, a conventional patterning method is used according to the ingredient or the film formation method. Examples of such a patterning method include a mask vapor deposition method, a photolithography method, a wet etching method, a dry etching method, and the like.

According to the first embodiment of the present invention, the partition wall 23 is formed so as to partition the luminescent region corresponding to each pixel. The partition wall 23 acts as a partitioning component partitioning each of the plurality of pixels. When the luminescent medium layer is positioned to each pixel by a patterning using the wet coating method, it is possible to prevent any colors from mixing in between adjacent pixels since the partition wall 23 is provided as described above. In addition, since a recessed and projected shape is provided on the surface of the partition wall 23, a leak current is reduced in the luminescent medium layer formed on the entire surface of the display region, as described below.

It is preferred that the partition wall 23 is formed so as to cover the end part of the first electrode 12. Usually, according to an active matrix driving type organic electroluminescent display device 50, the first electrode 12 is formed on each pixel. In order to enlarge the size of each pixel as much as possible, the size of the pixel region of the first electrode 12 that is exposed is made to be as large as possible. Therefore, the partition wall 23 is formed so as to cover the end part of the first electrode 12. The most preferred flat surface form of the partition wall 23 is a reticular form. The partition wall 23 is placed between the pixel electrodes 12 so as to partition adjacent pixel electrodes 12. The partition wall 23 may be structured to have a plurality of layers (a laminated structure). In this case, it is necessary that at least the partition wall portion positioned at the highest layer have a recessed and projected shape. For a partition wall portion that does not have any recessed and projected shape, similar materials and manufacturing methods may be used as the configuration described below in the second embodiment.

It is preferable that the ingredients making up the partition wall 23 be a photosensitive resin such that a recessed and projected shape may be easily formed. A positive type resist and a negative type resist may both be used as the photosensitive resin. It is also possible to use a resin which is commercially available. It is necessary that the resist have insulating properties. When the partition wall 23 does not have sufficient insulating properties, a displaying abnormality occurs because an electric current runs through between adjacent pixel electrodes 12 through the partition wall 23. In particular, examples of the materials of the partition wall 23 include a polyimide type material, an acrylic resin type material, a novolac resin type material, and a florene type material. The present invention is not limited to these configurations. Other materials may be used. Further, to enhance the quality of the displaying properties of the organic EL element, a material having a light shielding property may be included in the photosensitive material.

The photosensitive resin, making up the partition wall 23, is applied using a known coating method such as a spin coater, a bar coater, a roll coater, a dye coater, and a gravure coater. Next, the photosensitive resin is patterned by an exposure processing using a mask. The exposed photosensitive resin is developed. In this way, the pattern for the partition wall 23 is formed. Conventional methods of exposure and development are used as the procedures for forming the pattern of the partition wall 23. In addition, in the burning procedure, the partition wall 23 may be burned by using a conventional method using an oven, a hotplate, and the like.

An example of a patterning method of the partition wall 23 includes the step of applying a photosensitive resin on a substrate 11, and the step of obtaining a predetermined pattern using a photolithography method. The present invention is not limited to this configuration. Another method may be used. A surface processing such as a plasma irradiation or an UV irradiation and the like may be applied to the resist and the photosensitive resin if necessary.

It is preferable that the film thickness of the partition wall 23 be in the range of 0.5 μm to 5.0 μm. The partition wall 23 is provided between adjacent pixel electrodes 12. As a result, it is possible to prevent a short circuit from occurring between adjacent pixel electrodes 12 at an end part of the transparent electrode (positive electrode) 12. When the height (film thickness) of the partition wall 23 is too low, the effect of preventing a short circuit may not be obtained. Meanwhile, when the height (film thickness) of the partition wall 23 is too high, a steep step surface is formed on the partition wall 23. It becomes difficult to form opposing electrodes 17 (a negative electrode, a second electrode) on this step surface. When the opposing electrodes 17 (a negative electrode, a second electrode) are severed due to this step surface, a displaying abnormality occurs. Furthermore, when a partition wall having a film thickness within the above range is formed, and a luminescent medium layer is formed using a printing method, it is possible to prevent a spreading of the luminescent medium layer ink (the liquid material that becomes the luminescent medium layer) printed on each of the pixel electrodes 12.

Next, a surface processing is performed in order to create a recessed and projected shape on the surface of the partition wall 23. A conventional wet etching method or a dry etching method may be used as the surface processing. Among these, it is preferable to irradiate the plasma under a condition in which a sputtering effect is obtained. In particular, in the case of a partition wall structured by a resin, the recessed and projected shape may be easily made on the surface of the partition wall. Examples of the introduction gas provided to the chamber in which such a surface processing is performed include Ar, $N_2$, He, $F_2$, $O_2$, $H_2$, $NH_3$, and the like. One type of such a gas may be used. Two or more types of such a gas may be used as well. In particular, by exposing the surface of the partition wall 23 with oxygen plasma (a plasma including oxygen), it is possible to obtain the effect of cutting the surface of the partition wall 23 in a preferable manner.

The size or the depth of the recessed portion and the projected portion of the recessed and projected shape may be adjusted according to the type of gas, the electric power, the pressure, and the irradiation time used or applied to form the plasma. By adjusting the size or the depth of the recessed portion and the projected portion, it is possible to obtain the effect of severing the film formed on the recessed portion and the projected portion. Alternatively, it is possible to increase the specific resistance. When the plasma irradiation is performed until the calculated average roughness Ra exceeds 200 nm, the quality of the film of the partition wall 23 may change. As a result, it is preferable that the Ra is between 1 nm and 200 nm. It is more preferable that Ra is between 1 nm and 50 nm. When an oxygen plasma is used, and an irradiation is performed with an electric power of 50 W to 300 W, it is possible to form a desired recessed and projected shape within five minutes or so (between two to ten minutes). In terms of achieving efficiency, it is preferred that the degree of vacuum be less than or equal to 1 Pa.

Furthermore, when a plasma processing is performed in the pretreatment process of the substrate, the surface processing of the partition wall 23 may be performed simultaneously with the pretreatment of the substrate. It is also possible to perform the pretreatment of the substrate separately from the surface processing of the partition wall 23. Either the pretreatment or the surface processing may be performed first.

Furthermore, in order to clean the surface of the first electrode used as the positive electrode and to adjust the work function, a UV processing or a plasma processing may be performed as a pretreatment process of the substrate. In order to inject a positive hole into the luminescent medium layer in an efficient manner, it is preferred that the work function at the surface of the positive electrode contacting the luminescent medium layer be close to the work function of the luminescent medium layer. Therefore, it is preferred that the difference between the work function at the surface of the positive electrode being processed with surface treatment and the work function of the luminescent medium layer contacting the positive electrode be less than or equal to 0.5 eV, more preferably, less than or equal to 0.2 eV.

When an ITO is used, the work function before the surface treatment is approximately 4.8 eV. Meanwhile, when a hole transport layer or a hole injection layer is formed as a luminescent medium layer on the positive electrode as described later, the work function of a molybdenum oxide, for instance is approximately 5.8 eV. Therefore, before the surface treatment is performed, the difference between the work function of the positive electrode and the work function of the hole transport layer is too large. As a result, the hole injection barrier becomes high. Therefore, it becomes difficult for the hole to be injected. Therefore, the work function of the positive electrode is enhanced by surface treatment. In this way, the work function of the positive electrode becomes close to the work function of the positive transport layer.

Furthermore, a low pressure mercury lamp, a high pressure mercury lamp, an excimer lamp, and the like, are used as the optical source of the UV processing. Either of these optical sources may be used in the present invention. When an oxygen plasma processing is used, it is possible to control the work function of the positive electrode in a desired manner by adjusting the electric power, pressure, and the plasma irradiation time. When the oxygen plasma processing is used, an etching effect is somewhat created at the partition wall 23 at the same time as the surface treatment of the positive electrode. Therefore, in the case of the surface treatment of the positive electrode, it is necessary to adjust the conditions for the surface treatment while taking into consideration, the etching effect of the partition wall 23.

The ITO surface processed with a surface treatment returns to its original state as time passes. Therefore, it is preferred that the surface treatment of the positive electrode be performed before the hole transport layer 14 is formed.

Next, the hole injection layer is a layer acting to inject a hole from a transparent electrode (positive electrode). The hole transport layer is a layer acting to transport a hole to the luminescent layer. These layers may possess both the hole injection feature and the hole transport feature. In this case, depending on the degree of these features, the layer may be referred to using one type of feature or both types of features. According to each of the embodiments of the present invention, a layer referred to as the hole transport layer also includes a hole injection layer.

In order to efficiently inject a hole from the hole transport layer 14 into the luminescent medium layer (for example, an interlayer) positioned at an upper layer of the hole transport layer, as a value representing the characteristic of the hole transport layer 14, it is preferred that the hole transport layer 14 have a work function which is equivalent to or greater than the work function of the positive electrode (first electrode 12). Depending on the material of the positive electrode that is selected, the suitable value representing the characteristic of the hole transport layer 14 varies. However, it is possible to use a hole transport layer 14 having a work function of greater than or equal to 4.5 eV and less than or equal to 6.5 eV. When the positive electrode is an ITO or an IZO, it is possible to use a hole transport layer 14 having a work function of greater than or equal to 5.0 eV and less than or equal to 6.0 eV in a preferable manner. Furthermore, according to the bottom emission structure, the emitted light is extracted by permeating through the first electrode 12. As a result, when the light permeability of the hole transport layer 14 is low, the efficiency of ejection decreases. Therefore, in an optical wavelength region, it is preferred that the average light permeability of the hole transport layer 14 be greater than or equal to 75%, more preferably, greater than or equal to 85%.

Examples of the ingredient of such a hole transport layer include polyaniline, polythiophene, polyvinyl carbazole, and a polymer material such as a compound of a poly 3,4-ethylenedioxithiophene and polystyrene sulfonate. Other than these ingredients, a conductive polymer having a conductivity of $10^{-2}$ S/cm to $10^{-6}$ S/cm may be preferably used. A polymer ingredient may be used in a film formation process by a wet method. Therefore, it is preferable to use a polymer ingredient when the hole injection layer or a hole transport layer is formed. Such a polymer ingredient is scattered or dissolved by water or a solvent. The polymer ingredient is used as a scattered liquid or a solution.

When an inorganic material is used as a hole transport ingredient, examples of such an inorganic material that can be used include a transition metal oxide such as $Cu_2O$, $Cr_2O_3$, $Mn_2O_3$, NiO, CoO, $Pr_2O_3$, $Ag_2O$, $MoO_2$, ZnO, $TiO_2$, $V_2O_5$, $Nb_2O_5$, $Ta_2O_5$, $MoO_3$, $WO_3$, $MnO_2$ and the like, and an inorganic compound including one or more types of a nitride or a sulfide of these materials.

The hole transport layer 14 is formed at once on the entire display region of the substrate 11 using a simple method such as the spin coat method, a dye coat method, a dipping method, or a slit coating method and the like. When the hole transport layer 14 is formed, an ink (liquid material) is used. This ink is obtained by dissolving the hole transport ingredient into water, organic solvent, or a mixture of these solvents. Examples of the organic solvents that may be used include toluene, xylene, anisole, mesitylene, tetrahydronaphthalene, acetone, methyl ethyl ketone, methyl isobutyl ketone, cyclohexanone, methanol, ethanol, isopropyl alcohol, ethyl acetate, butyl acetate, and the like. Further, a surfactant, an anti-oxidant, a viscosity modifier, an ultraviolet absorbing agent, and the like may be added to the ink.

When the hole transport layer 14 is an inorganic material, the hole transport layer 14 may be formed using a dry process such as a resistance heating vapor deposition method, an electron beam vapor deposition method, a reactive vapor deposition method, an ion plating method, and a sputtering method.

According to the present invention, in a case in which the inorganic material hole transportation layer is formed using a dry process, two effects may be obtained. First, the manufacturing process may be performed easily. Second, the leak current may be reduced. Conventionally, it has been difficult to perform a patterning for each pixel using a mask due to the problematic precision of the positioning of the pattern and the pixel. According to the method based on the present invention, it is possible to achieve an organic EL display device with a low leak current without performing any patterning.

When the first electrode 12 is a positive electrode, the hole transport layer 14 is formed as the first layer of the luminescent medium layer 19. Therefore, it is preferable to form a hole transport layer 14 on the entire surface of the display region including the surface of the partition wall 23 having a recessed and projected shape. As described above, the hole transport layer 14 may be formed easily. Furthermore, according to the present invention, the leak current may be restrained even if the hole transport layer 14 is formed on the entire surface of the substrate 11. In this case, the hole transport layer 14 is formed evenly on the luminescent pixel part (pixel region). However, the film thickness of the hole transport layer 14 on the partition wall 23, which has an irregular surface, becomes uneven. Therefore, as described above, the specific resistance of the film increases. Here, "the film thickness of the hole transport layer 14 is uneven" refers to a condition in which the film thickness of a part of the hole transport layer 14 formed on the partition wall 23 is extremely thin, or, a condition in which the luminescent medium layer is discontinuously distributed at the cross section of the partition wall 23, as shown in FIG. 7. In a case in which the film thickness of the hole transport layer 14 is less than or equal to the depth of the recessed and projected shape, the film of the hole transport layer 14 is severed by the recessed portion or the projected portion of the recessed and projected shape. As a result, the hole transport layer 14 is formed on the partition wall 23 as a discontinuous film. Therefore, the leak current running in the horizontal direction (film surface direction) is restrained or reduced. Further, even if the hole transport layer 14 is formed so that the film thickness of the hole transport layer 14 is greater than or equal to the depth of the recessed and projected shape, when the film thickness of the hole transport layer 14 becomes uneven, the specific resistance may increase due to a minute recessed and projected shape, and the leak current in the horizontal direction is restrained or reduced.

It is preferred that an interlayer 15 be provided between the organic luminescent layer and the hole transport layer as an electron blocking layer. In this way, the luminescent lifetime of the organic EL element may be enhanced. According to a top emission type element structure, the interlayer 15 may be stacked on top of the hole transport layer 14 after the hole transport layer 14 is formed. Normally, the interlayer 15 is formed so as to cover the hole transport layer 14. However, the interlayer 15 may be formed by patterning, if necessary.

Examples of an organic ingredient of the interlayer 15 include a polyvinyl carbazole or its derivative, a polyarylene derivative having a polyaromatic amine in a side chain or a principal chain, an arylamine derivative, a triphenyldiamine derivative, and the like, which are polymers including a polyaromatic amine. Further, examples of an inorganic ingredient of the interlayer 15 include a transition metal oxide such as $Cu_2O$, $Cr_2O_3$, $Mn_2O_3$, NiO, CoO, $Pr_2O_3$, $Ag_2O$, $MoO_2$, ZnO, $TiO_2$, $V_2O_5$, $Nb_2O_5$, $Ta_2O_5$, $MoO_3$, $WO_3$, $MnO_2$, and the like, and an inorganic compound including one or more types of a nitride or a sulfide of these materials. The present invention is not limited to these ingredients. Other ingredients may be used.

The organic ingredients of the interlayer 15 are dissolved in the solvent, or scattered in a stable manner, and are used as an organic interlayer ink (a liquid ingredient of an organic interlayer). Examples of the solvent in which the ingredient of the organic interlayer is dissolved or scattered include toluene, xylene, acetone, anisole, methyl ethyl ketone, methyl isobutyl ketone, cyclohexanone, and the like, in its single form, or as a combined solvent of these materials. In particular, an aromatic organic solvents such as toluene, xylene, and anisole are preferably used from the viewpoint of the solubility of the organic interlayer ingredient. Further, a surfactant, an anti-oxidant, a viscosity modifier, an ultraviolet absorbing agent, and the like may be added to the organic interlayer ink, if necessary.

As an ingredient of an interlayer, it is preferable to select an ingredient having a work function which is equivalent to or greater than the work function of the hole transport layer 14, and is equivalent to or less than the work function of the organic luminescent layer 16. This is because, when the carrier is injected from the hole transport layer 14 to the organic luminescent layer 16, unnecessary injection barriers are not formed. Further, in order to obtain the effect of shutting in an electric load which could not contribute to the luminescence from the organic luminescent layer 16, it is preferred that an ingredient having a band gap of greater than or equal to 3.0 eV is used. It is more preferable that the ingredient have a band gap of greater than or equal to 3.5 eV.

According to the ingredient of the interlayer 15, the interlayer 15 may be formed using a traditional film forming method such as a dry film formation method or a wet film formation method. Examples of the dry film formation method include a resistance heating vapor deposition method, an electron beam vapor deposition method, a reactive vapor deposition method, an ion plating method, and a sputtering method. Examples of the wet film formation method include an ink jet printing method, a typography method, a gravure printing method, and a screen printing method. The present invention is not limited to the above configuration. Another method may be used.

Further, at the organic luminescent layer 16, a hole is recombined with the electron injected by an electric voltage applied between the first electrode 12 and the second electrode 17. An emitted light, created at the time of this recombination, is obtained. The emitted light passes through a translucent electrode, and is ejected outside the organic EL element. When the luminescent layer formed on each of the adjacent pixels is different, for example, in a display device showing a full color display in RGB, each of the organic luminescent layers 16R, 16G, and 16B are formed on each luminescent pixel part (pixel region) of the first electrode 12 using a patterning.

An example of an ingredient for the organic luminescent layer 16 is a material obtained by dissolving a luminescent colorant into a polymer. Examples of the luminescent colorant include a coumarin type substance, a perylene type substance, a pyran type substance, an anthrone type substance, a porphyrin type substance, a quinacridone type substance, an N,N'-dialkyl substituted quinacridone type substance, a naphthalimide type substance, an N,N'-diaryl substituted pyrrolopyrrole type substance, and the like. Examples of the polymer include polystyrene, polymethylmethacrylate, polyvinyl carbazole, and the like. Furthermore, the ingredient for the organic luminescent layer 16 may be a polymer luminescent material such as a dendrimer substance, a PPV type substance, a PAF type substance, a polyparaphenylene type substance, and the like. Furthermore, it is preferable that the material for the organic luminescent layer 16 be a material that is soluble in water or a solvent.

These ingredients for the luminescent layer are dissolved into a solvent or scattered in a stable manner, and are used as organic luminescent ink (the liquid ingredient for the luminescent layer). Examples of the solvents that may be used to dissolve or scatter the organic luminescent material include toluene, xylene, acetone, anisole, methyl ethyl ketone, methyl isobutyl ketone, cyclohexanone, and the like. These materials may be used in a singular form, or as a mixture of multiple solvents. Among these, it is preferable to use an aromatic type organic solvent such as toluene, xylene, and anisole from the perspective of the solubility of the organic luminescent material. Further, a surfactant, an anti-oxidant, a viscosity modifier, an ultraviolet absorbing agent, and the like may be added to the organic luminescent ink, if necessary.

In addition to these polymer ingredients described above, a low molecular type luminescent material may be used. Examples of the low molecular type luminescent material include a 9,10-diaryl anthracene derivative, pyrene, coronene, perylene, rubrene, 1,1,4,4-tetraphenyl butadiene, tris (8-quinolate) aluminum complex, tris (4-methyl-8-quinolate) aluminum complex, b is 8-quinolate) zinc complex, tris (4-methyl-5-trifluoromethyl-8-quinolate) aluminum complex, tris (4-methyl-5-cyano-8-quinolate) aluminum complex, bis(2-methyl-5-trifluoromethyl-8-quinolinolato)[4-(4-sianophenyl) phenolate]aluminum complex, bis(2-methyl-5-siano-8-quinolinolato)[4-(4-sianophenyl) phenolate] aluminum complex, tris(8-quinolinolato) scandium complex, bis[8-(para-tosyl)aminoquinolin]zinc complex and cadmium complex, 1,2,3,4-tetraphenylcyclopentadiene, poly-2,5-diheptyloxy-para-phenylenevinylene, and the like.

When the ingredient of each of the organic luminescent layer 16 is a low molecular luminescent material, the organic luminescent layer 16 may be formed by using a dry process such as, principally, the vapor deposition method. When the ingredient of each of the organic luminescent layer 16 is a material obtained by scattering a polymer luminescent material or a low molecular luminescent material in a polymer, the organic luminescent layer 16 may be formed by using a printing method such as a screen printing method or the inkjet method and the like. When the organic luminescent layer 16 is formed by using a printing method, it is possible to use an ink such that the luminescent material described above is dissolved in an organic solvent, water, or a mixture of these solvents.

The electron injection layer transports an electron from the negative electrode. The electron transport layer transports an electron to the luminescent layer. These electron injection layer and the electron transport layer may both inject an electron and transport an electron. In such a case, depending on the degree of these features, the layer may be referred to using one type of feature or both types of features.

Examples of the ingredient of such an electron injection layer or an electron transport layer include a nitro substituted fluorine such as a 1,2,4-triazole derivative (TAZ), a diphenylxon derivative, and the like.

Next, a second electrode (opposite electrode) 17 according to the first embodiment of the present invention is formed on the luminescent medium layer 19. According to an active matrix driven type organic EL display device, the second electrode is formed on the entire surface of the display region. In particular, a single body metal such as Mg, Al, Yb, and the like is used as an ingredient of the second electrode 17. Further, at a boundary surface between the second electrode 17 and the luminescent medium layer 19, a compound such as Li, Li oxide, LiF, and the like is formed for approximately 1 nm. It is possible to use a configuration such that Al or Cu, which has a high degree of stability and a high degree of conductivity, is stacked on this compound. Further, in order to obtain both an effective injection of an electron and stability, it is possible to use an alloy type substance obtained by one or more type of metal having a low work function such as Li, Mg, Ca, Sr, La, Ce, Er, Eu, Sc, Y, Yb, and the like, and a stable metallic element such as Ag, Al, Cu, and the like. In particular, an alloy such as MgAg, AlLi, CuLi, and the like may be used. Furthermore, it is possible to use a transparent conductive film including a metallic complex oxide such as ITO (indium tin oxide complex), IZO (indium zinc oxide complex), AZO (aluminum zinc oxide complex), and the like.

According to an organic EL display device having a top emission type structure, the light emitted from the luminescent medium layer 19 passes through a second electrode 17. Therefore, it is necessary that the second electrode 17 have light permeability in the optical wavelength region. Thus, it is preferred that the film thickness of the transparent conductive film be adjusted so that an average light permeability of 85% or greater is obtained in the optical wavelength region. When a metallic single body such as Mg, Al, Yb, and the like is used as an ingredient of the second electrode 17, it is preferred that the film thickness be less than or equal to 20 nm, more preferably, within the range of 2 nm to 7 nm. In the case of a metallic film, it is preferred that the film thickness be adjusted so that an average light permeability of greater than or equal to 70% is obtained in the optical wavelength region.

The second electrode 17 may be formed using a traditional film forming method such as a dry film formation method or a wet film formation method according to the material of the second electrode 17. Examples of the dry film formation method include a resistance heating vapor deposition method, an electron beam vapor deposition method, a reactive vapor deposition method, an ion plating method, and a sputtering method. Examples of the wet film formation method include an ink jet printing method, a gravure printing method, and a screen printing method. The present invention is not limited to the above configuration. Another method may be used.

The sealing body 28 is provided, for example, on a substrate 11 on which the first electrode 12, the partition wall 23, the luminescent medium layer 19, and the second electrode 17, are formed. In particular, the sealing body 28 and the substrate 11 are bonded together in a surrounding area of the substrate 11. As a result, the sealing body 28 and the substrate 11 are sealed. According to an organic EL display device having a top emission type structure, the light emitted from the luminescent medium layer passes through the sealing body 28 positioned at an opposite side of the substrate 11, and is ejected outside of the organic EL display device. Therefore, a high degree of light permeability is necessary in the optical wavelength region. It is preferred that an optical permeability of greater than or equal to 85% be obtained.

Next, a structure of the sealing body 28 is described. This description is provided with an example in which a sealing cap 26 such as a glass cap or a metallic cap having a concaved part is used. In this case, a peripheral part of the sealing cap 26 and a peripheral part of the substrate 11 are connected so that the first electrode 12, the partition wall 23, the luminescent medium layer 19, and the second electrode 17 are positioned in a space inside the sealing cap 26. Thus, the space between the sealing cap 26 and the substrate 11 is sealed. The sealing cap 26 and the substrate 11 are bonded together using an adhesive. Further, a moisture absorbing agent is formed inside the concaved portion, and an inactive gas such as nitrogen gas and the like is filled inside the concaved portion. In this way, it is possible to prevent the quality of the organic EL element from deteriorating due to moisture and gas entering the concaved portion.

Furthermore, as a sealing structure, it is possible to employ a structure in which a sealing plate 29 and a resin layer 21 are used. In this case, a structure is employed in which a resin layer 21 is provided between the substrate 11 and the sealing plate 29. The first electrode 12, the partition wall 23, the luminescent medium layer 19, and the second electrode 17 are formed on the substrate 11. An example of a method of forming this structure is a method in which the resin layer 21 is formed on the sealing plate 29, the resin layer 21 and the substrate 11 are placed so as to face one another, and the sealing plate 29 and the substrate 11 are bonded together.

As an ingredient of the sealing plate 29, a substrate with a low permeability of moisture and oxygen is used. Examples of the ingredient of the sealing plate 29 include ceramics such as alumina, silicon nitride, boron nitride, and the like, glass such as an alkali-free glass and an alkali glass, quartz, moisture resistant film, and the like. Examples of the moisture resistant film include a film such that an $SiO_x$ is formed on both sides of the plastic substrate with the CVD method, a film with a low light permeability, a film having water-absorbing characteristics, or a polymer film applied with a water-absorbing agent. It is preferred that the moisture vapor transmission rate of the moisture resistant film be less than or equal to $1 \times 10^{-6}$ g/m²/day.

Examples of the ingredient of the resin layer include a light hardening type adhesive resin, a heat hardening type adhesive resin, a double liquid hardening type adhesive resin, including an epoxy type resin, an acrylic type resin, a silicone resin, and the like, an acrylic type resin such as an ethylene ethyl acrylate (EEA) polymer and the like, a vinyl type resin such as ethylene vinyl acetate (EVA) and the like, a thermoplastic resin such as polyamide, synthesized rubber, and the like, and thermoplastic adhesive resin of an acid denaturation such as polyethylene and polypropylene. Examples of a method of forming the resin layer 21 on the sealing plate 29 include the solvent solution method, the extrusion lamination method, the fusion/hot-melting method, the calendar method, the nozzle application method, the screen printing method, the vacuum lamination method, the heat rolling lamination method, and the like. An ingredient having a moisture absorbing characteristic or an oxygen absorbing characteristic may be included in the ingredient of the resin layer 21, if necessary. The thickness of the resin layer 21 formed on the sealing plate 29 is determined voluntarily according to the size and shape of the organic EL element that is sealed. However, it is preferred that the thickness of the resin layer 21 be approximately 5 μm to 500 μm.

It is preferred that the procedure of bonding the sealing body 28 with the substrate 11, on which the first electrode 12, the partition wall 23, the luminescent medium layer 19, and the luminescent medium layer 17 are formed, be performed in an inert gas atmosphere or in a vacuum. When the sealing body 28 is configured to be a two-layer structure including the sealing plate 29 and the resin layer 21, and when a thermoplastic resin is used as the ingredient of the resin layer 21, it is preferred that the sealing body 28 be pressure bonded to the substrate 11 using a heated roll.

Meanwhile, when a thermoplastic adhesive resin is used as an ingredient of the resin layer 21, it is preferred that, after the sealing body 28 is pressure bonded to the substrate 11 using a heated roll, a heat hardening be further performed at a hardening temperature.

Moreover, when a photocrosslinkable adhesive resin is used as an ingredient of the resin layer 21, the resin may be hardened by, after the sealing body 28 is pressure bonded to the substrate 11 using a roller, further irradiating light to the photocrosslinkable adhesive resin. Incidentally, according to the method described above, the resin layer 21 is formed on the sealing plate 29. However, it is possible to form the resin layer 21 on the substrate 11, and bond the sealing plate 29 to the substrate 11.

As a pretreatment procedure of sealing the organic EL element on the substrate 11 using a sealing plate 29, or as a substitute of the sealing procedure described above, it is possible to form a sealing body 28 including a passivation film, for example. In this case, a passivation film including an inorganic thin film such as a silicone nitride film and the like is formed using a dry process such as the EB vapor deposition method or the CVD method and the like. Furthermore, it is possible to employ a structure in which the passivation film is combined with the sealing structure. The film thickness of the passivation film is set to, for example, 100 nm to 500 nm. The suitable film thickness varies depending on the moisture permeability of the ingredient and the moisture vapor light permeability of the ingredient. However, a film thickness of 150 nm to 300 nm is preferable. In the case of a top emission type structure, it is necessary to adjust the film thickness by selecting the type of ingredient of the sealing structure by taking into consideration the light permeability as well as the characteristics described above. It is preferred that the overall average light permeability be greater than or equal to 70% in the optical wavelength region.

Second Embodiment

Next, the second embodiment is described.

In the description of the second embodiment, the same components described in the first embodiment are referred to using the same reference number. Descriptions of such components may be omitted or simplified. Furthermore, as long as the configuration of the first embodiment is consistent with the configuration of the second embodiment, the configuration described in the first embodiment is also applied to the second embodiment.

Figure 8A:
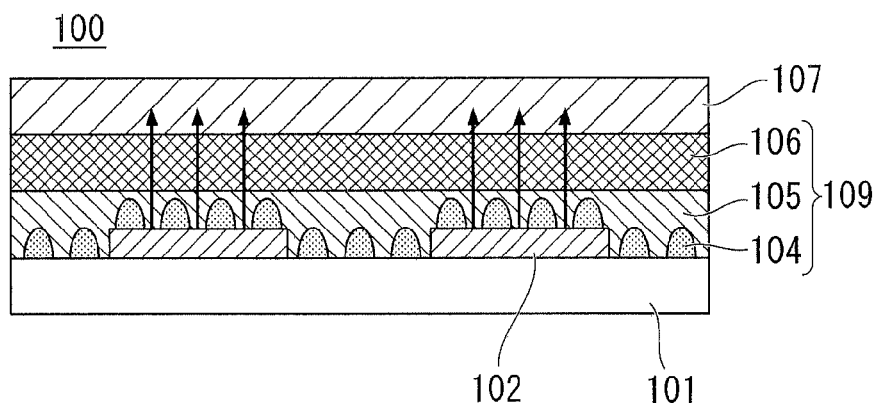
FIG. 8A is a cross sectional diagram showing an organic EL element according to a second embodiment of the present invention.

FIG. 8A is a cross sectional view of an organic electroluminescent element (organic EL element) according to the second embodiment of the present invention.

According to the organic EL element 100 shown in FIG. 8A based on the second embodiment, a luminescent medium layer 109 is provided between the first electrode 102 and the second electrode 107. The luminescent medium layer 109 includes the luminescent layer 106 and the hole transport layer 104. Other than the luminescent layer 106 and the hole transport layer 104, the luminescent medium layer 109 may include a laminated structure in which an electric load block layer (interlayer 105), a hole injection layer, an electron injection layer, an electron transport layer, and the like are combined as appropriate.

A plurality of first electrodes 102 are formed by patterning on each pixel. Corresponding to each of the first electrodes 102, a luminescent layer 106 which emits light at a luminescent wave length of red (R), green (G), and blue (B), a pigment conversion layer, or a color filter are formed.

According to the organic EL element shown in FIG. 8A based on the present invention, a hole transport layer 104 is formed on the patterned first electrode (positive electrode) 102 and the entire surface of the substrate including a region at which the first electrode is not formed.

The hole transport layer is formed in an island-like manner on the substrate and on the first electrode 102. In other words, a plurality of island-like portions including a hole transport layer is formed on the substrate and on the first electrode 102. These plurality of island-like portions are distributed discontinuously on the substrate and on the first electrode 102. These plurality of island-like portions are provided so as to protrude towards the second electrode 107 from the first electrode 102.

Moreover, the surface of the first electrode 102 includes an area at which the island-like portion is created and an area at which the island-like portion is not created. An interlayer 105 is formed on the area at which the island-like portion is not created.

According to such a configuration shown in FIG. 8A, an electric current runs from the positive electrode (first electrode) 102 to the negative electrode (second electrode) 107, as indicated in the upward pointing arrow in the luminescent medium layer 109. As a result, the organic EL element is illuminated.

Figure 8B:
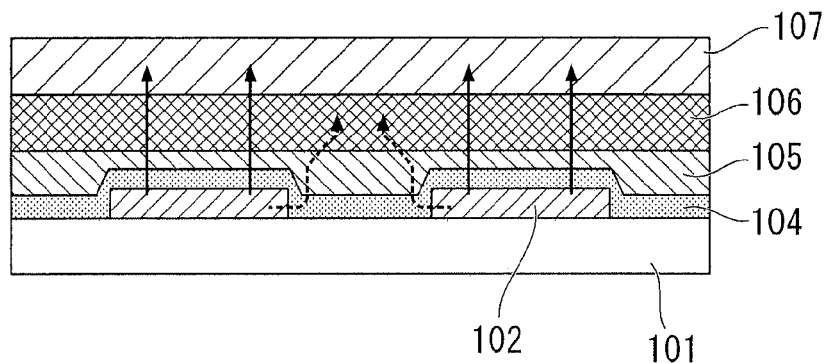
FIG. 8B is a cross sectional diagram showing a conventional organic EL element.

Meanwhile, according to a conventional organic EL element shown in FIG. 8B, the hole transport layer 104 is formed in a planar manner on the substrate and on the first electrode 102. However, according to the conventional example shown in FIG. 8B, the electric load not only moves from the positive electrode (first electrode) 102 to the negative electrode (second electrode) 107, but also moves in the hole transport layer 104 in the film surface direction. Therefore, a leak current occurs, as shown in a dashed arrow.

According to the structure of the organic EL element based on the second embodiment, the island-like portion including the hole transport layer 104 is formed discontinuously. Therefore, the value of resistance of the hole transport layer 104 in the film surface direction becomes strikingly large. As a result, it is possible to restrain a leak current occurring due to the hole transport layer 104.

Figure 9:
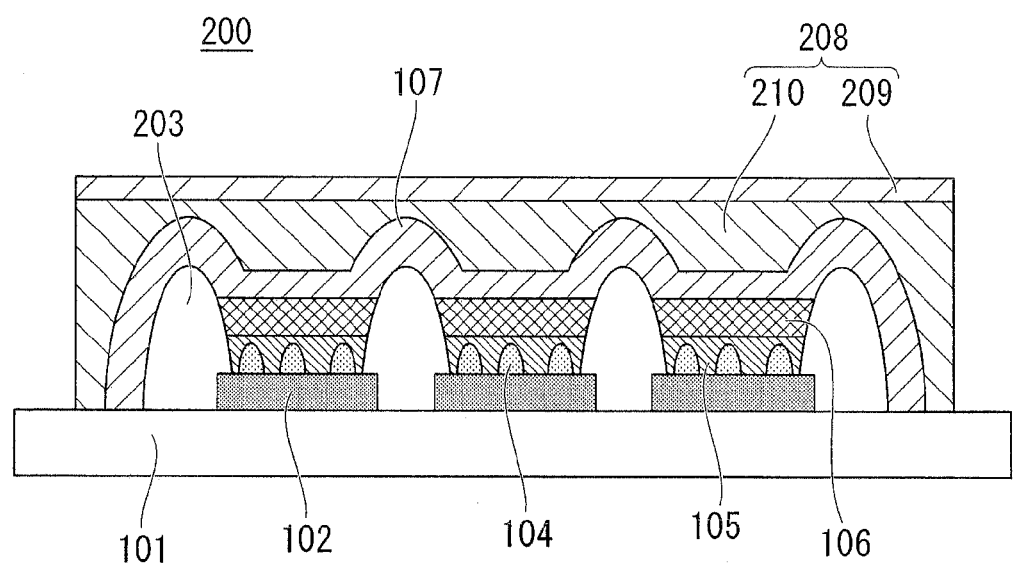
FIG. 9 is a cross sectional diagram showing an organic EL display device according to a second embodiment of the present invention.

FIG. 9 is a cross sectional view of an organic EL display device (organic EL element) according to the second embodiment of the present invention.

The display device 200 using the organic EL element according to the second embodiment of the present invention shown in FIG. 9 includes a substrate 101, a first electrode (positive electrode, pixel electrode) 102, a partition wall 203, a hole transport layer 104, an interlayer 105, an organic luminescent layer 106, a luminescent medium layer 109, a second electrode (negative electrode) 107, and a sealing body 208. The first electrode 102 is provided on each pixel on the substrate 101. The partition wall 203 partitions between pixels of the first electrode 102. The hole transport layer 104 is formed above the first electrode 102. The interlayer 105 is formed on the hole transport layer 104. The organic luminescent layer 106 is formed on the interlayer 105. The second electrode 107 is formed so as to cover the entire surface of the organic luminescent layer 106. The luminescent medium layer 109 includes the first electrode 102, the partition wall 203, the hole transport layer 104, the interlayer 105, and the organic luminescent layer 106. The sealing body 208 contacts the substrate 101 so as to cover the second electrode 107.

The luminescent medium layer 109 is a layer sandwiched between the first electrode (positive electrode) 102 and the second electrode (negative electrode) 107. In the luminescent medium layer 109 shown in FIG. 9, the hole transport layer 104, the interlayer 105, and the organic luminescent layer 106 correspond to the luminescent medium layer 109. Other than these components, layers such as the hole injection layer, the electron transport layer, and the electron injection layer may be added to the luminescent medium layer 109 as well.

Figure 10A:
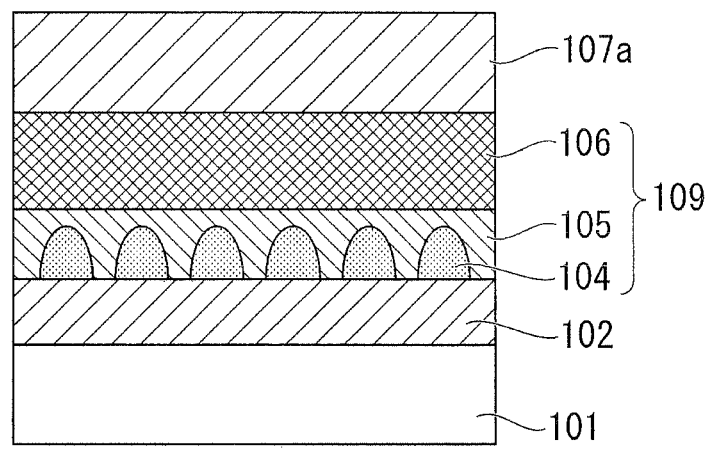
FIG. 10A is a cross sectional diagram showing a stacked layer structure of an organic EL element according to a second embodiment of the present invention.
Figure 10B:
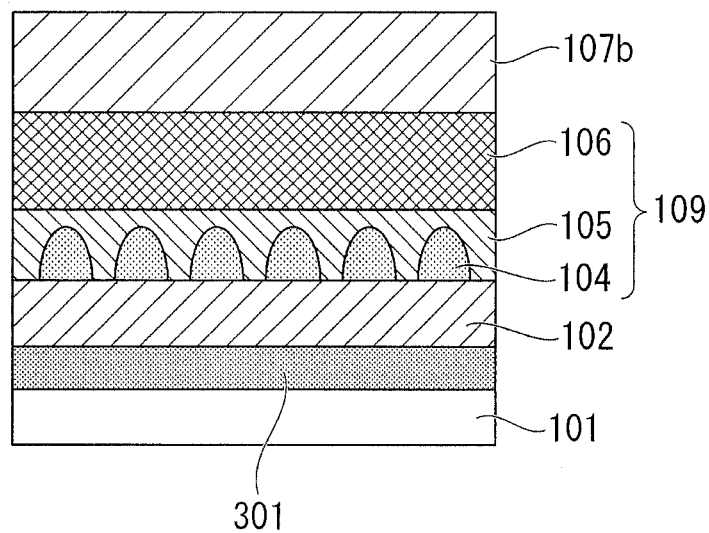
FIG. 10B is a cross sectional diagram showing a stacked layer structure of an organic EL element according to a second embodiment of the present invention.

FIG. 10A and FIG. 10B are cross sectional diagrams of a laminated portion of the organic EL element according to the second embodiment.

FIG. 10A shows a bottom emission type organic electroluminescent element.

The first electrode 102, the hole transport layer 104, the organic luminescent layer 106, and the second electrode 107a are stacked on the substrate 101 in this order. According to a structure in which a plurality of layers are stacked in this order, an interlayer 105 or another luminescent medium layer may be provided between the plurality of layers. The second electrode 107 is a light impermeable electrode. A material having a high reflection rate, such as metal and the like, is used as the material for the second electrode 107. In this way, light, emitted towards the second electrode 107, is reflected at the second electrode 107. Further, the emitted light may be ejected outside the organic EL element through the first electrode 102, which is an optically-transparent electrode. In this way, it is possible to enhance the efficiency of extracting light.

FIG. 10B shows an example of a top emission type organic EL element. A reflection layer 301, a first electrode 102, a hole transport layer 104, an interlayer 105, an organic luminescent layer 106, and a second electrode 107 are stacked on the substrate 101 in this order. According to this structure of the organic EL element such that a plurality of layers are stacked in this order, another layer may be placed between a plurality of layers. The second electrode 107 is an optically-transparent electrode. Light emitted towards the first electrode 102 passes through the first electrode 102 and is reflected at the reflection layer 301. This light is emitted outside the organic EL element through the second electrode 107. Meanwhile, light emitted towards the second electrode 107 similarly passes through the second electrode 107, and is emitted outside the organic EL element.

In the following description, the present embodiment is described with a bottom emission type organic electroluminescent element being given as an example. However, it is possible to apply the configuration of the present embodiment to a top emission type organic electroluminescent element using a transparent conductive film as the material for the second electrode 107.

Regarding the ingredient for the substrate 101, the same ingredient for the substrate 11 in the first embodiment described above is used. Further, similar to the first embodiment, it is preferred that an anti-moisture processing or a hydrophobic processing be performed on the substrate 101. Further, it is preferred that the moisture content and the gas permeability coefficient of the substrate 101 is small.

The first electrode 102 is formed on the substrate 101 by patterning, if necessary. The first electrode 102 is partitioned by the partition wall 203. Thus, the first electrode 102 is a pixel electrode corresponding to each pixel (sub pixel).

Regarding the ingredient for the first electrode 102, the same ingredient for the first electrode 12 in the first embodiment described above is used.

In addition, regarding the structure for the first electrode 102, the same structure for the first electrode 12 in the first embodiment described above is used.

Furthermore, regarding the forming method of the first electrode 102, the same forming method of the first electrode 12 in the first embodiment described above is used.

Moreover, regarding the patterning method of the first electrode 102, the same patterning method of the first electrode 12 in the first embodiment described above is used.

In the case of a top emission type, it is preferred that a reflection layer 301 (see FIG. 10A and FIG. 10B) be formed at a lower portion of the first electrode.

Regarding the ingredient for the reflection layer 301, the same ingredient for the reflection layer 31 in the first embodiment described above is used.

In addition, regarding the structure for the reflection layer 301, the same structure for the reflection layer 31 in the first embodiment described above is used.

Furthermore, regarding the forming method of the reflection layer 301, the same forming method of the reflection layer 31 in the first embodiment described above is used.

Moreover, regarding the patterning method of the reflection layer 301, the same patterning method of the reflection layer 31 in the first embodiment described above is used.

According to the second embodiment of the present invention, the partition wall 203 is formed so as to partition the luminescent region corresponding to each pixel.

It is preferred that the partition wall 203 is formed so as to cover the end part of the first electrode 102. Usually, according to an active matrix driving type organic electroluminescent display device 200, the first electrode 102 is formed on each pixel. In order to enlarge the size of each pixel as much as possible, the size of the pixel region of the first electrode 102 that is exposed is made to be as large as possible. Therefore, the partition wall 203 is formed so as to cover the end part of the first electrode 102. The most preferred flat surface form of the partition wall 203 is a reticular form. The partition wall 203 is placed between the pixel electrodes 102 so as to partition adjacent pixel electrodes 102.

A material with insulating properties is used as the ingredient of the partition wall 203. Examples of such an ingredient include a photosensitive material and the like. A positive type photosensitive material may be used as well as a negative type photosensitive material. Examples of the photosensitive material include a light hardening resin such as a light radical polymer type resin and a light cation polymer type resin; a copolymer including an acrylonitril component; polyvinyl phenol, polyvinyl alcohol; novolac resin; polyimid resin; cyano ethyl pullulan; and the like. When an inorganic material is used as the ingredient of the partition wall 203, $SiO_2$, $TiO_2$, and the like are used.

It is preferable that the height of the partition wall 203 be greater than or equal to 0.1 µm and less than or equal to 30 µm, more preferably, greater than or equal to approximately 0.5 µm and less than or equal to approximately 2 µm. When the height of the partition wall 203 is greater than 20 µm, a steep step surface is formed due to the partition wall 203. It becomes difficult to form opposing electrodes 107 (a negative electrode, a second electrode) on this step surface. When the opposing electrodes 107 (a negative electrode, a second electrode) are severed due to this step surface, a displaying abnormality occurs.

The partition wall 203 may be formed using a traditional film forming method such as a dry film formation method or a wet film formation method according to the material of the partition wall 203. Examples of the dry film formation method include a resistance heating vapor deposition method, an electron beam vapor deposition method, a reactive vapor deposition method, an ion plating method, and a sputtering method. Examples of the wet film formation method include an ink jet printing method, a gravure printing method, and a screen printing method. The present invention is not limited to the above configuration. Another method may be used.

An example of a patterning method of the partition wall 203 includes the step of forming an inorganic film evenly on a substrate (substrate 101 and a first electrode 102), the step of masking with a resist, and a subsequent step of performing a dry etching. Regarding the patterning method, the step of applying a photosensitive resin on a substrate, and the step of obtaining a predetermined pattern using a photolithography method may be performed. The present invention is not limited to this configuration. Another method may be used. A water repellent agent may be added to the resist and the photosensitive resin, if necessary. Furthermore, regarding the structure of the partition wall 23, a configuration with a plurality of layers (laminated structure) may be applied. For example, it is possible to use a laminated structure such that a layer formed by hydrophilic material and a layer formed by hydrophobic material are stacked. Furthermore, after the partition wall 203 is formed, a water repellant characteristic or a hydrophilic characteristic may be provided to the material formed on the partition wall 203 by irradiating with plasma or UV.

The hole transport layer 104 according to the second embodiment of the present invention is stacked between the first electrode 102 and the interlayer 105. As shown in FIG. 10, when the hole transport layer 104 is formed on the first electrode in an island-like manner, the interlayer 105 is formed on the first electrode 102 so as to partially contact the first electrode 102.

According to this configuration, a hole is injected from the first electrode (positive electrode) 102, and the hole transport layer 104 transports an electric load to the interlayer 105. There is a problem in that a leak current occurs due to the structure of the element at a layer contacting the first electrode (positive electrode) 102. This problem is not limited to the hole transport layer 104.

Figure 11A:
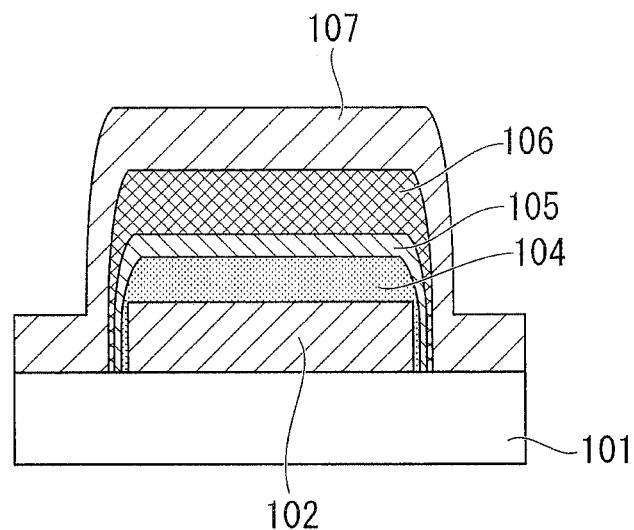
FIG. 11A is a cross sectional diagram showing an organic EL element as an illustration of an embodiment of the present invention.
Figure 11B:
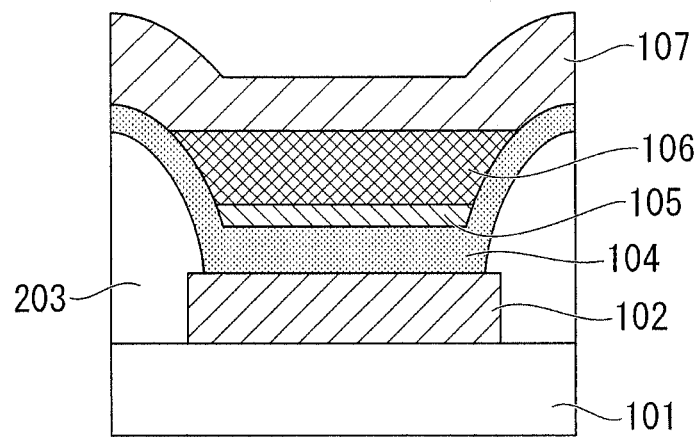
FIG. 11B is a cross sectional diagram showing an organic EL element as an illustration of an embodiment of the present invention.

Next, referring to FIGS. 11A and 11B, the problem of a leak current is described.

FIG. 11A is a cross sectional view showing a structure of an organic EL element used to evaluate the initial characteristic of the organic EL element.

According to FIG. 11A, the ingredient of the first electrode 102 is provided on the entire surface of the substrate 101. Thereafter, the first electrode 102 is formed by patterning using a photolithography method. The angle between an end surface of the first electrode 102 and the surface of the substrate is between 60 degrees to 90 degrees. Other than a CVD method from which a high coverage may be obtained, when the luminescent medium layer 109 and the second electrode 107 is formed on the first electrode 102, the thickness of the film formed on the end surface of the first electrode 102 becomes thinner than the thickness of the film formed on the foreground surface of the first electrode 102.

According to this structure, an electric current can easily run through a film, except for a film formed on the foreground surface of the first electrode 102. Meanwhile, the electric current may easily run through the foreground surface of the first electrode 102. Thus, a normal illumination may be obtained easily. Therefore, a leak current does not occur easily, even in a case in which the luminescent medium layer 109 is formed using an inorganic material with a small specific resistance.

FIG. 11B is a cross sectional view of an organic EL element. The structure shown in FIG. 11A is different from the structure shown in FIG. 11B in that the partition wall 203 is formed on the end portion of the first electrode 102.

The angle between the surface of the end portion of the partition wall 203 and the surface of the first electrode 102 is approximately 30 degrees to 50 degrees. When the hole transport layer 104, the interlayer 105, the organic luminescent layer 106, and the second electrode 107 are formed on the first electrode 102 and the partition wall, the thickness of the film formed on the first electrode 102 becomes approximately the same as the thickness of the film formed on the partition wall.

According to this structure, when an inorganic material having a small specific resistance is used as the ingredient of the hole transport layer 104, the electric load injected from the first electrode 102 moves to the hole transport layer 104 on the partition wall 203, a leak current occurs, and a normal illumination cannot be obtained. According to such a structure, the characteristic of the organic EL element declines. In this way, in particular, according to a structure such that the partition wall 203 is formed between adjacent pixels, a leak current occurs, which runs through the hole transport layer formed on the entire surface of the organic EL element. This leak current has a large influence on the characteristic of the organic EL element.

In order to solve the problem of the structure of the element shown in FIG. 11B, a structure, such that the hole transport layer 104 of the organic EL element according to the second embodiment is island-shaped, is preferably used.

According to the organic EL element and the organic EL display device based on the second embodiment, at least a portion of the hole transport layer 104 is a discontinuous region because an ingredient of the hole transport layer is placed in a segmentalized manner into a plurality of minute isolated regions (islands). In other words, the hole transport layer 104 has a region in which an island-like portion is formed.

Figure 12A:
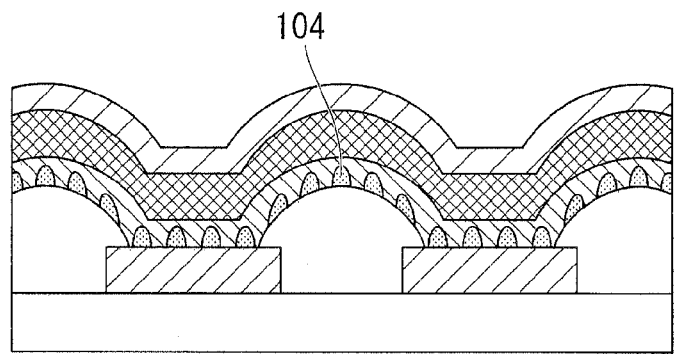
FIG. 12A is a cross sectional diagram showing an example of a configuration of a hole transport layer of an organic EL element according to a second embodiment of the present invention.
Figure 12B:
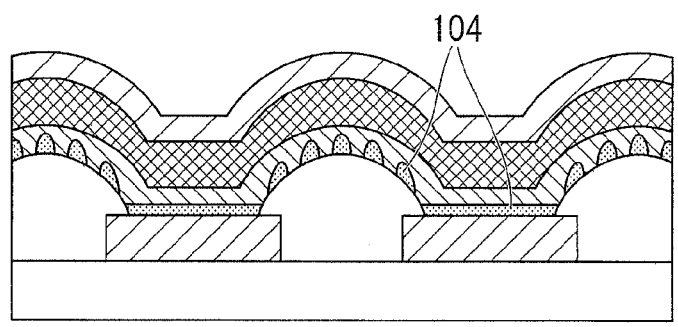
FIG. 12B is a cross sectional diagram showing an example of a configuration of a hole transport layer of an organic EL element according to a second embodiment of the present invention.
Figure 12C:
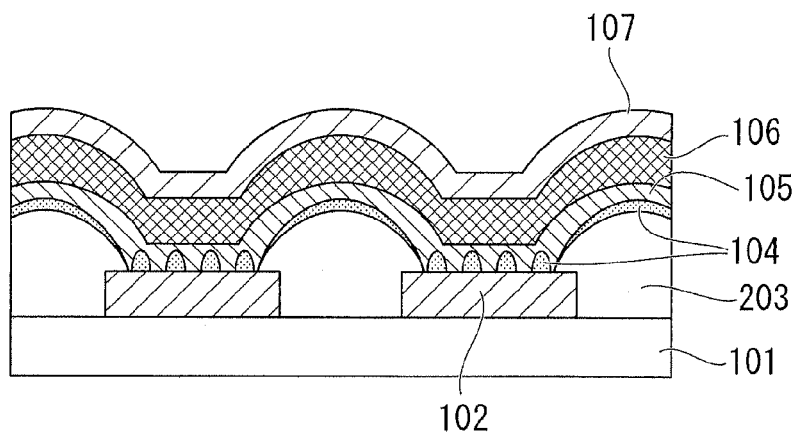
FIG. 12C is a cross sectional diagram showing an example of a configuration of a hole transport layer of an organic EL element according to a second embodiment of the present invention.

Next, referring to FIGS. 12A to 12C, an example of a hole transport layer 104 which can obtain a remarkable effect of restraining an occurrence of a leak current is described.

FIG. 12A shows a structure in which a hole transport layer 104 having an island-like structure is formed on the entire surface of the first electrode 102 and the partition wall 203. According to this structure, the path of an electric load moving in a film surface direction of the hole transport layer 104 is discontinuous. Thus, this path is severed. As a result, it is possible to remarkably restrain an electric current running toward the second electrode 107 from a region outside the first electrode 102.

FIG. 12B shows a structure, such that a hole transport layer 104 having an island-like structure only on the partition wall 203, is formed. According to this FIG. 11B, the electric load injected from the first electrode 102 moves to a hole transport layer 104 formed along a curved surface of the partition wall 203. In this way, a leak current occurs. Meanwhile, according to the structure shown in FIG. 12B, a hole transport layer having an island-like structure on the partition wall 203 is formed. In other words, a discontinuous hole transport layer is formed. A leak current may be restrained in a remarkable manner due to this structure.

FIG. 12C shows a structure, such that a hole transport layer 104 having an island-like structure only on the first electrode 102, is formed. According to this structure, the hole transport layer is formed discontinuously on the first electrode 102, on which an electric voltage is applied. As a result, it is possible to sever the path of the electric load moving from the hole transport layer 104, formed on the first electrode 102, to the hole transport layer 104, formed on the partition wall 203. In this way, it is possible to restrain a leak current in a remarkable manner.

Thus, according to all of the structures shown in FIGS. 12A to 12C, there is a high specific resistance in the horizontal direction (film surface direction) from the hole transport layer 104, formed on the first electrode 102, to the hole transport layer 104, formed on the partition wall 203. Therefore, it is possible to restrain the leak current.

A suitable film thickness of the island-like structure of the hole transport layer 104 is greater than or equal to 0.5 nm and is less than or equal to 20 nm. When the film thickness exceeds 20 nm, it is difficult to form a hole transport layer 104 having an island-like structure. Moreover, according to a structure such that the hole transport layer 104 is formed by an inorganic ingredient having a low specific resistance, the leak current may easily occur. Further, when the film thickness is greater than or equal to 30 nm, even if an island-like structure may be formed, the difference between the top portion (projected portion) of the recessed and projected shape formed on the surface of the hole transport layer 104 and the bottom portion (recessed portion) becomes large. As a result, the hole transport layer 104 may contact the luminescent medium layer 109 including a plurality of layers, and there is a possibility that the characteristic of the organic EL element declines. Furthermore, when the film thickness of the hole transport layer 104 becomes thinner than 0.5 nm, the characteristic of the hole transport layer 104 declines.

Examples of an ingredient of the hole transport layer 104 include a transition metal oxide such as $Cu_2O$, $Cr_2O_3$, $Mn_2O_3$, NiO, CoO, $Pr_2O_3$, $Ag_2O$, $MoO_2$, ZnO, $TiO_2$, $V_2O_5$, $Nb_2O_5$, $Ta_2O_5$, $MoO_3$, $WO_3$, $MnO_2$, and the like, and an inorganic compound including one or more types of a nitride or a sulfide of these materials. Examples of the structure of the hole transport layer 104 include a single layered structure including the material described above, a laminated structure including a plurality of layers, or a compound layer.

The hole transport layer 104 may be formed using a known dry film formation method or a wet film formation method. Examples of the dry film formation method include a resistance heating vapor deposition method, an electron beam vapor deposition method, a reactive vapor deposition method, an ion plating method, a sputtering method, and the like. Examples of the wet film formation method include a spin coating method, a sol-gel method, and the like. The present invention is not limited to these configurations. A different method may be used. A normal film formation method may be used.

A crystal growth of a thin film is affected by a balancing of a surface energy of a film formed on the substrate, a surface energy of a substrate, and a boundary surface energy between a film and a substrate.

A surface energy of a film formed on the substrate is represented by $\sigma_f$. A surface energy of a substrate is represented by $\sigma_s$. A boundary surface energy between a film and a substrate is represented by $\sigma_{fs}$. The thin film contacts the substrate at a contact angle of $\theta$. Then, the following Young's equation (1) holds.

$$\sigma_f \cos\theta + \sigma_{fs} = \sigma_s \qquad (1)$$

In order to obtain a thin film having an island-like structure, the following equation (2) should be satisfied. The equation (2) shows a condition in which a thin film particle cannot easily move (a wet characteristic is low) on a substrate (or a partition wall).

$$\sigma_f + \sigma_{fs} = \sigma_s \qquad (2)$$

In this case, the surface energy of the film is determined based on the characteristic of the inorganic ingredient itself and the characteristic of the film formation method. For example, in a case in which the sputtering method is used, a film is formed with a low film formation speed and under a high pressure. A thin film formed in this way cannot move easily on the substrate 101 or on the partition wall 203. Thus, it is possible to obtain a thin film having an island-like structure. In addition, the surface energy of the substrate 101 may be controlled appropriately by selecting the type of the substrate appropriately, selecting the type of the surface processing (pretreatment such as a plasma processing and the like, for instance) of the substrate appropriately, and by adjusting the conditions of the surface processing.

It is preferred that the physical characteristic value of the hole transport layer 104 be a similar physical characteristic value of the hole transport layer 14 according to the first embodiment.

Furthermore, in a bottom emission type structure, the emitted light is obtained by permeating the first electrode 102. Therefore, when the light permeability of hole transport layer 104 is low, the extraction efficiency declines. As a result, it is preferred that the average light permeability of the hole transport layer 104 be greater than or equal to 75% in an optical wavelength region, more preferably, greater than or equal to 85%.

The features of the interlayer 105 according to the second embodiment of the present invention is the same as the interlayer 15 according to the first embodiment.

In addition, the same ingredient used for the interlayer 15 according to the first embodiment is used as the ingredient for the interlayer 105.

In addition, the same solvent used for the interlayer 15 according to the first embodiment is used as the solvent in which the ingredient of the interlayer 105 is dissolved or scattered.

In addition, the same structure used for the interlayer 15 according to the first embodiment is used as the structure for the interlayer 105.

In addition, the same formation method used for the interlayer 15 according to the first embodiment is used as the formation method for the interlayer 105.

In addition, the same patterning method used for the interlayer 15 according to the first embodiment is used as the patterning method for the interlayer 105.

According to the organic EL element based on the second embodiment, it is preferred that the luminescent medium layer 109 be formed on a discontinuous hole transport layer 104 having an island-like structure, using a wet film formation method. The reason for this preference is described below.

Figure 13A:
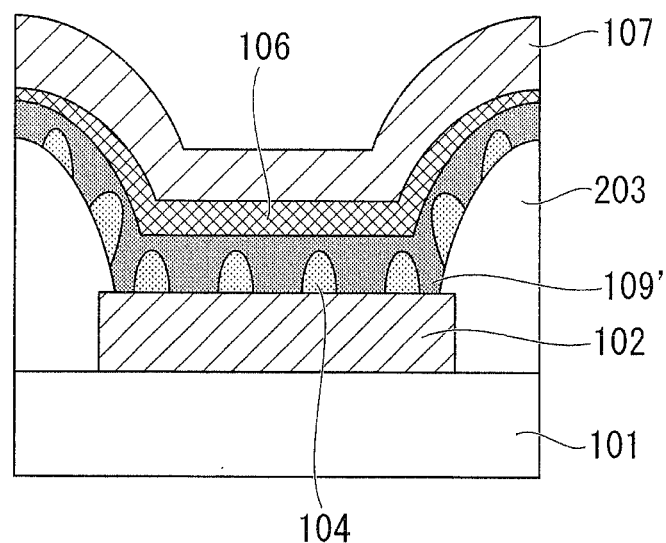
FIG. 13A is a cross sectional diagram illustrating a difference in a condition in which layers of a luminescent medium layer are stacked by a film forming method.
Figure 13B:
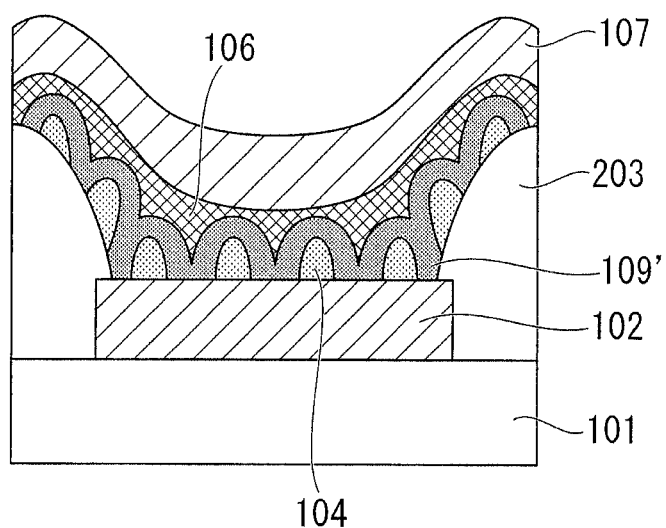
FIG. 13B is a cross sectional diagram illustrating a difference in a condition in which layers of a luminescent medium layer are stacked by a film forming method.

FIGS. 13A and 13B are diagrams illustrating the differences between the structures of the luminescent medium layer 109' due to the difference in the film formation method used to form the organic luminescent medium layer 109'.

FIG. 13A shows an organic EL element having a luminescent medium layer 109' formed by using a wet film formation method. FIG. 13B shows an organic EL element having a luminescent medium layer 109' formed by using a dry film formation method.

Furthermore, similar to FIG. 12A, FIGS. 13A and 13B show a structure in which an island-like portion of the hole transport layer 104 is formed on the surface of the first electrode 102 and the surface of the partition wall 203.

As described above, the hole transport layer 104 according to the second embodiment has an island-like structure (island-like portion). As a result, recessed and projected portions are formed on the surface of the hole transport layer 104. As shown in FIG. 13B, for example, when the luminescent medium layer 109' is formed using a vacuum vapor deposition method and the like, a luminescent medium layer 109' is formed along a recessed and projected shape of the discontinuous foundation film (hole transport layer 104, island-like portion). As a result, a recessed and projected surface is formed on the luminescent medium layer 109', corresponding to the recessed and projected shape of the foundation film. In addition, the organic luminescent layer 106 formed on the recessed and projected surface of the luminescent medium layer 109' has a portion having a large film thickness and a portion having a small film thickness. In this case, a high voltage is applied locally to a portion of the organic luminescent layer having a small film thickness. Therefore, a large load may be applied to this portion.

On the other hand, according to the luminescent medium layer 109' formed by using a dry film formation method, as shown in FIG. 13A, the ink (liquid material) of the luminescent medium layer 109' is applied to the hole transport layer 104 having an island-like structure, a surface of the first electrode 102, and a surface of the partition wall 203. As a result, a leveling effect (leveling property) of the ink is created. The luminescent medium layer 109' is formed by an ink leveled in this manner. As a result, the luminescent medium layer 109' is formed along the surface shape of the first electrode 102 and the surface shape of the partition wall 203. On the surface of the luminescent medium layer 109', there is no recessed and projected portion corresponding to the island-like recessed and projected shape. Further, an organic luminescent layer 106 is formed along the surface shape of the luminescent medium layer 109'. The film thickness of the organic luminescent layer 106 is even, as shown in FIG. 13A.

According to such a structure, a high electric voltage is prevented from being applied locally to the organic luminescent layer 106. Thus, it is possible to prevent a large load from being applied. As a result, various effects may be obtained, such as prolonging the longevity of the organic EL element.

In particular, among the wet film formation methods, the typography method is superior in leveling characteristics because ink may be transcribed to the pixel of the opening portion between adjacent partition walls 203, while pushing out the ink using a projected portion of the proof.

By using a wet film formation method to form the organic luminescent medium layer 109' between the hole transport layer 104 and the luminescent layer 106, the organic luminescent medium layer 109' acts as a buffer layer used to flatten the film.

According to the structure of the organic EL element and the organic EL display device shown in FIGS. 8A, 8B, and 9, the interlayer 105 is formed using the wet film formation method. Thus, the interlayer 105 may act as a buffer layer. A buffer layer may be structured to include a plurality of organic luminescent medium layers. However, in order to prevent a decline in the characteristic of the organic EL element, it is preferable to cover the recessed and projected shape of the hole transport layer 104 with a single layer. Therefore, it is particularly preferred that the film thickness of the buffer layer be greater than or equal to the film thickness of the hole transport layer 104.

The organic luminescent layer 106 is stacked on the interlayer 105 formed earlier. When the emitted light of the organic luminescent layer 106 is a single color, the organic luminescent layer 106 may be formed so as to cover the entire display region including the partition wall. In order to obtain an emitted light having a plurality of colors, a patterning is used, to form an organic luminescent layer 106 having different emitted light color for each pixel, if necessary.

The same ingredient used for the organic luminescent layer 16 in the first embodiment is used for the organic luminescent material used to form the organic luminescent layer 106.

Furthermore, the same formation method used for the organic luminescent layer 16 in the first embodiment is used as the formation method used to form the organic luminescent layer 106.

Among the formation methods of the organic luminescent layer 106, when the organic luminescent layer 106 is formed using a wet film formation method in particular, it is preferable to use a wet film formation method, as described above, to form the organic luminescent medium layer 109' positioned at a lower layer of the organic luminescent layer 106. In this case, a leveling effect is obtained due to the applied ink. Thus, the recessed and projected shape created in the region formed on the island-like portion is covered. In this way, the organic luminescent medium layer 109' is formed along a surface form of the first electrode 102 and the surface form of the partition wall 203. As a result, the film thickness of the organic luminescent layer 106 becomes even. Thus, it is possible to form an organic EL element that does not have any unevenness in illumination.

Furthermore, among the film formation methods described above, it is preferred that a typography method is used in the manufacturing process of the organic EL display device and the formation method of the organic luminescent layer 160. According to the typography method, it is unnecessary to apply an ink on the entire surface of the substrate 11. It is possible to place ink on the position of each of a plurality of pixels. In this way, using the typography method is superior in terms of productivity and manufacturing costs.

Next, a second electrode 107 is formed on the organic luminescent layer 106. In the case of an active matrix driven type organic EL display device, the second electrode 107 is formed on the entire surface of the display region.

Further, the same ingredient used for the second electrode 17 according to the first embodiment is used as the ingredient for the second electrode 107.

Further, the same structure used for the second electrode 17 according to the first embodiment is used as the structure for the second electrode 107.

Further, the same formation method used for the second electrode 17 according to the first embodiment is used as the formation method for the second electrode 107.

In addition, the sealing structure used in the first embodiment is used as the sealing structure according to the sealing body 208.

In addition, the same ingredient used for the sealing plate 29 according to the first embodiment is used as the ingredient for the sealing plate 209.

In addition, the same ingredient used for the resin layer 21 according to the first embodiment is used as the ingredient for the resin layer 210.

In addition, the same formation method used for the resin layer 21 according to the first embodiment is used as the formation method for the resin layer 210.

In addition, the same film thickness used for the resin layer 21 according to the first embodiment is used as the film thickness for the resin layer 210.

Furthermore, the same sealing structure provided by the sealing plate 29 and the resin layer 21 according to the first embodiment is applied as the sealing structure provided by the sealing plate 209 and the resin layer 210.

The technical scope of the present invention is not limited to the embodiments described above. Various alterations are possible as long as the alterations do not deviate from the gist of the present invention.

The present embodiment was described according to an organic EL display device, which is one of an organic electroluminescent device. However, the present invention is not limited to a display device. An organic electroluminescent device according to the presents invention may be applied to an illumination device as well.

WORKING EXAMPLE

Next, a working example of an organic EL display device according to the first and second embodiments described above is described. The present invention is not limited to the following working examples.

First, referring to working examples 1 through 3 and comparative example 1, a working example of an organic EL display device according to the first embodiment is described.

Working Example 1

First, a glass substrate (light permeable substrate) is prepared. The size of the glass substrate is a 2.2 inch size diagonally. An ITO (indium-tin oxide) thin film is formed on the glass substrate using a sputtering method. The ITO film is patterned using a photolithography method and an etching method using an acid solution. In this way, a pixel electrode having a plurality of line patterns is formed. According to the plurality of linen patterns, the width between the lines is 136 µm, while the interval between adjacent lines is 30 µm. Further, 192 lines are formed on the glass substrate which is approximately 40 mm square.

Next, a partition wall is formed as described below. A positive type photosensitive polyimid (Photoniece DL-1000 manufactured by Toray Industries, Inc.) is spin coated to the entire surface of the glass substrate on which a pixel electrode is formed. As a condition for the spin coating, the glass substrate is rotated for five seconds at 150 rpm. Then, the glass substrate is rotated for 20 seconds at 500 rpm. The height of the partition wall (the film thickness of the positive type photosensitive polyimid) is 1.5 μm. A photolithography method is used to expose the photosensitive ingredient applied on the entire surface of the glass substrate. This photosensitive ingredient is then developed. As a result, a partition wall having a line pattern is formed so that the partition wall covers an end part of each pixel electrode. Then, an oven is used to perform a baking under the condition of 230° C. for 30 minutes.

Next, as a surface treatment of ITO, an irradiation of an ultraviolet ray is performed. In particular, the UV/$O_3$ cleaning device manufactured by Orc Manufacturing Co., Ltd. is used to perform an irradiation of an ultraviolet ray for three minutes on the glass substrate on which the partition wall is formed. The work function of the ITO before the irradiation of the ultraviolet ray is performed is 4.8 eV. The work function of the ITO after the irradiation of the ultraviolet ray is performed is 5.3 eV.

Next, as a surface treatment of the partition wall, a plasma device (manufactured by Yamato Scientific Co., Ltd.) is used to perform an irradiation of an oxygen plasma for five minutes at an oxygen gas pressure of 0.003 torr at an applied electric power of 150 W on a glass substrate on which the partition wall is formed. The calculated average roughness Ra of the surface of the partition wall changed from 0.5 nm to 10 nm. Furthermore, when an SEM is used to observe the surface of the partition wall, a plurality of minute recessions and projections of a nano-order were formed on the surface.

Next, the hole transport layer 14 is formed. Molybdenum oxide is used as an inorganic material making up the hole transport layer 14. A film of molybdenum oxide of 10 nm is formed by using a sputtering method so that the film is formed on the entire surface of the display region. Incidentally, the film thickness of the molybdenum oxide is calculated from the film formation speed and the film formation time. A similar film thickness is used in each of the following working examples as well. During the patterning process, a metal mask having an opening of 33 mm×33 mm was used.

A film of molybdenum oxide is formed evenly on the luminescent pixel part. Further, the film of molybdenum oxide formed on the partition wall is severed by the minute recessions and projections formed on the partition wall. As a result, a discontinuous film of molybdenum oxide is formed on the partition wall.

Next, a polyphenylene vinylene derivative is used as an organic luminescent material. An organic luminescent ink is prepared. According to this organic luminescent ink, the organic luminescent material is dissolved into toluene so that the concentration of the organic luminescent material is 1%. Using this ink, a typography method is used to print the luminescent layer on the pixel sandwiched between partition walls, so that a matching is made to the line pattern of the pixel electrode. The film thickness of the luminescent layer dried after the printing process is 100 nm.

Next, on the luminescent layer, a line pattern of a negative electrode layer including Ca and Al was formed. In particular, the negative electrode layer is formed by a mask vapor deposition using a resistance heating vapor deposition method, so that a line pattern of a negative electrode layer and a line pattern of a pixel electrode crosses perpendicularly.

Finally, in order to provide protection from an outside oxygen or moisture, the organic EL construction, formed as described above, is sealed up using a glass cap and an adhesive. In this way, an organic EL display device is formed.

An extraction electrode at a positive electrode side connected to each pixel electrode is provided at a surrounding area of the display region of the organic EL display device obtained as described above. In addition, an extraction electrode at a negative electrode side connected to the negative electrode layer is provided. These extraction electrodes are connected to the electric power source. Further, the organic EL display panel is illuminated and displayed. In this way, the illumination condition and the display condition were observed.

When the organic EL display panel, obtained as describe above, was driven, a brightness of 3000 cd/cm$^2$ was obtained at a driving voltage of 7 V. A cross talk due to a leak current was not observed.

Working Example 2

Similar to Working Example 1, a glass substrate was prepared, a pixel electrode was formed, a partition wall was formed, and a surface treatment of the ITO was performed.

Next, in Working Example 2, as a surface treatment of the partition wall, a plasma device (manufactured by Yamato Scientific Co., Ltd.) is used to perform an irradiation of an oxygen plasma for eight minutes at an oxygen gas pressure of 0.003 torr at an applied electric power of 150 W on a glass substrate on which the partition wall is formed. The calculated average roughness Ra of the surface of the partition wall changed from 0.5 nm to 15 nm. Furthermore, when an SEM is used to observe the surface of the partition wall, a plurality of minute recessions and projections of a nano-order were formed on the surface.

Next, the hole transport layer 14 is formed. Molybdenum oxide is used as an inorganic material making up the hole transport layer 14. A film of molybdenum oxide of 30 nm is formed by using a sputtering method so that the film is formed on the entire surface of the display region. During the patterning process, a metal mask having an opening of 33 mm×33 mm was used.

A film of molybdenum oxide is formed evenly on the luminescent pixel part. Due to the minute recessed and projected shape formed on the partition wall, there was an increase in the specific resistance of the film of molybdenum oxide formed on the partition wall.

Next, the luminescent layer and the negative electrode layer is formed similar to Working Example 1.

When the organic EL display panel, obtained as describe above, was driven, a brightness of 2400 cd/cm$^2$ was obtained at a driving voltage of 7 V. A cross talk due to a leak current was not observed.

Working Example 3

Similar to Working Example 1, a glass substrate was prepared, a pixel electrode was formed, a partition wall was formed, and a surface treatment of the ITO was performed.

Next, in Working Example 3, as a surface treatment of the partition wall, a plasma device (manufactured by Yamato Scientific Co., Ltd.) is used to perform an irradiation of an argon plasma for ten minutes at an argon gas pressure of 0.003 ton at an applied electric power of 150 W on a glass substrate on which the partition wall is formed. The calculated average roughness Ra of the surface of the partition wall changed from 0.5 nm to 8 nm. Furthermore, when an SEM is used to observe the surface of the partition wall, a plurality of minute recessions and projections of a nano-order were formed on the surface.

Next, the hole transport layer 14, the luminescent layer, and the negative electrode layer is formed similar to Working Example 1.

When the organic EL display panel, obtained as describe above, was driven, a brightness of 2800 cd/cm$^2$ was obtained at a driving voltage of 7 V. A cross talk due to a leak current was not observed.

Comparative Example 1

First, similar to Working Example 1, a glass substrate was prepared, a pixel electrode was formed, a partition wall was formed, and a surface treatment of the ITO was performed.

Next, in Comparative Example 1, as a surface treatment of the partition wall, a plasma irradiation is not performed.

Next, the hole transport layer is formed. Molybdenum oxide is used as an inorganic material making up the hole transport layer. A film of molybdenum oxide of 30 nm is formed by using a sputtering method so that the film is formed on the entire surface of the display region. During the patterning process, a metal mask having an opening of 120 mm×300 mm was used.

A film of molybdenum oxide is formed evenly on the luminescent pixel part. There was no change in the specific resistance of the molybdenum oxide formed on the luminescent pixel part and the specific resistance of the molybdenum oxide formed on the partition wall.

Next, the hole transport layer, the luminescent layer, and the negative electrode layer is formed similar to Working Example 1.

When the organic EL display panel, obtained as describe above, was driven, a brightness of 300 cd/cm$^2$ was obtained at a driving voltage of 7 V. A cross talk due to a leak current was created.

The conditions of Working Examples 1 through 3, the conditions of Comparative Example 1, and evaluation results are shown in Table 1.

Incidentally, in order to evaluate whether there is a cross talk in the Working Examples and the Comparative Example, it was determined whether or not an area other than the luminescent pixel part was illuminating. Further, in order to measure the brightness in the Working Examples and the Comparative Example, light which is emitted only from the pixel part was collected, and the brightness of this collected light was measured.

As is evident from the evaluation result in Comparative Example 1, when a surface treatment of the partition wall is not performed, the hole transport layer formed on the partition wall is not severed. Alternately, there is no change in the specific resistance of the molybdenum oxide formed on the luminescent pixel part and the specific resistance of the molybdenum oxide formed on the partition wall. As a result, a leak current is generated. Furthermore, a cross talk occurred, or a decline in the luminosity brightness occurred.

Meanwhile, according to Working Examples 1, 2, and 3 of the present invention, a plurality of minute recessed and projected shapes are formed on the partition wall by performing a surface treatment on the partition wall. Next, a hole transport layer is formed on the partition wall. Here, the hole transport layer is severed due to the recessed and projected shapes formed on the partition wall. Alternately, the specific resistance of the hole transport layer formed on the partition wall increases compared to the specific resistance of the hole transport layer formed on the luminescent pixel part. As a result, an organic EL display panel with a high luminescent brightness was obtained while reducing or restraining a leak current, and without a cross talk being generated.

TABLE 1

| | | WORKING EXAMPLE 1 | WORKING EXAMPLE 2 | WORKING EXAMPLE 3 | COMPARATIVE EXAMPLE 1 |
|---|---|---|---|---|---|
| SURFACE TREATMENT OF PARTITION WALL | METHOD OF TREATMENT | O$_2$ PLASMA | O$_2$ PLASMA | Ar PLASMA | — |
| | ELECTRIC POWER [W] | 150 | 150 | 150 | — |
| | TIME [min] | 5 | 8 | 10 | — |
| | CALCULATED AVERAGE ROUGHNESS OF THE PARTITION WALL Ra [nm] | 0.5→10 | 0.5→15 | 0.5→8 | 0.5 |
| | FILM THICKNESS OF HOLE TRANSPORT LAYER [nm] | 10 | 30 | 30 | 30 |
| EVALUATION RESULT | STROKE | NONE | NONE | NONE | DETECTED |
| | LUMINOSITY BRIGHTNESS AT A DRIVING AT 7 V [cd/m$^2$] | 3000 | 2400 | 2800 | 300 |

Next, Working Example 4 and Comparative Example 3 are referred to in order to describe a working example of an organic EL display device according to the second embodiment.

Working Example 4

First, an active matrix substrate 101 is prepared. An ITO thin film is formed as a first electrode (pixel electrode) 102 on this active matrix substrate 101. The size of the substrate is 6 inches diagonally. The number of pixels is 320×240.

Next, a partition wall 203 is formed so that the partition wall 203 covers an end part of the first electrode 102 provided on the substrate 101, and so that the partition wall 203 partitions each of the plurality of pixels. The partition wall 203 is formed by using a positive resist to place an ingredient of the partition wall on the entire surface of the substrate 101 using a spin coating method. The thickness of the ingredient of the partition wall is 2 μm. Thereafter, a photolithography method is used to perform a patterning. In this way, the partition wall 203 is formed. Due to this partition wall 203, a pixel region is partitioned. The size of the pixel region is 0.12 mm×0.36 mm. The number of sub pixels is 960×240 dots.

A UV/O$_3$ cleaning is performed on the active matrix substrate 101. The partition wall 203 is formed on the active matrix substrate 101. In this cleaning procedure, a device provided with four low-pressure mercury lamps is used. The illuminance of the low-pressure mercury lamps is 13 mW/cm$^2$. In this way, light was irradiated to the substrate 101 for two minutes.

A hole transport layer 104 is formed on the active matrix substrate 101 processed with a UV/O$_3$ cleaning. Molybdenum oxide is used as an inorganic ingredient making up the hole transport layer 104. Here, two samples, Sample 1 and Sample 2 are prepared. Sample 1 is an active matrix substrate having a film thickness of the molybdenum oxide of 8 nm. Sample 2 is an active matrix substrate having a film thickness of the molybdenum oxide of 30 nm.

The sputtering method is used to form a film of molybdenum oxide on the active matrix substrate. In order to from the film on the entire surface of the display region, the patterning is performed using a metal mask having an opening of 116 mm×87 mm.

In the sputtering procedure, a molybdenum metallic target with a purity of 99.9% is used. Argon, which is an inactive gas, and oxygen, which is a reactive gas, are supplied to the chamber of the sputtering device. Further, a reactive DC magnetron sputtering method is used to form a film of molybdenum oxide on the active matrix substrate 101. The electric power density of the target is 1.3 W/cm$^2$. The ratio of the compound gas supplied to the chamber is such that argon is 2, while oxygen is 1. An exhaustion valve provided on the chamber is adjusted so that the degree of vacuum during the sputtering process becomes 0.3 Pa. In this way, the amount of gas provided to the chamber is adjusted. The film thickness of molybdenum oxide is controlled by adjusting the duration of the sputtering process. In this way, an active matrix substrate having a film thickness of the molybdenum oxide of 8 nm (Sample 1) and an active matrix substrate having a film thickness of the molybdenum oxide of 30 nm (Sample 2) are prepared.

Figure 14:
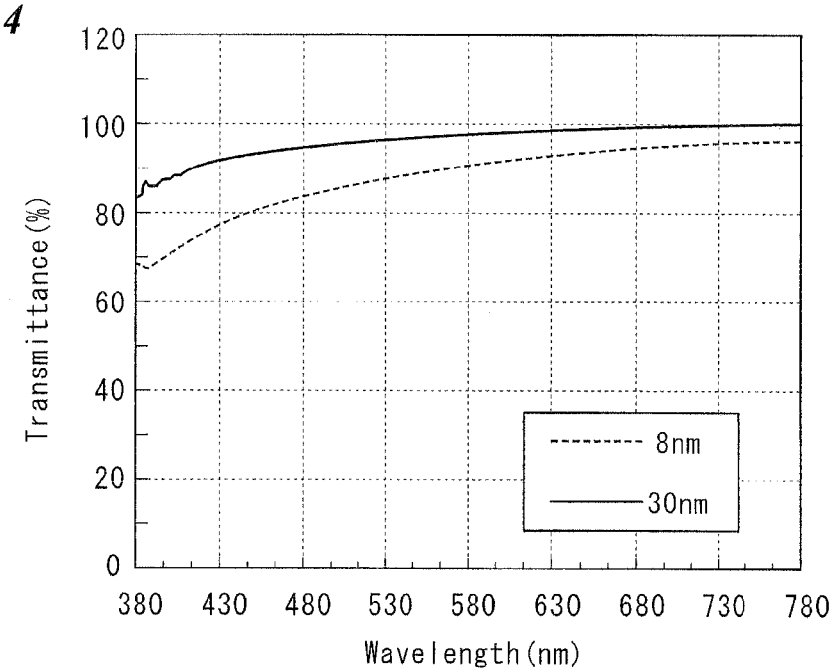
FIG. 14 is a diagram of a light permeability characteristic of a hole transport layer according to a working example of the present invention.
Figure 15:
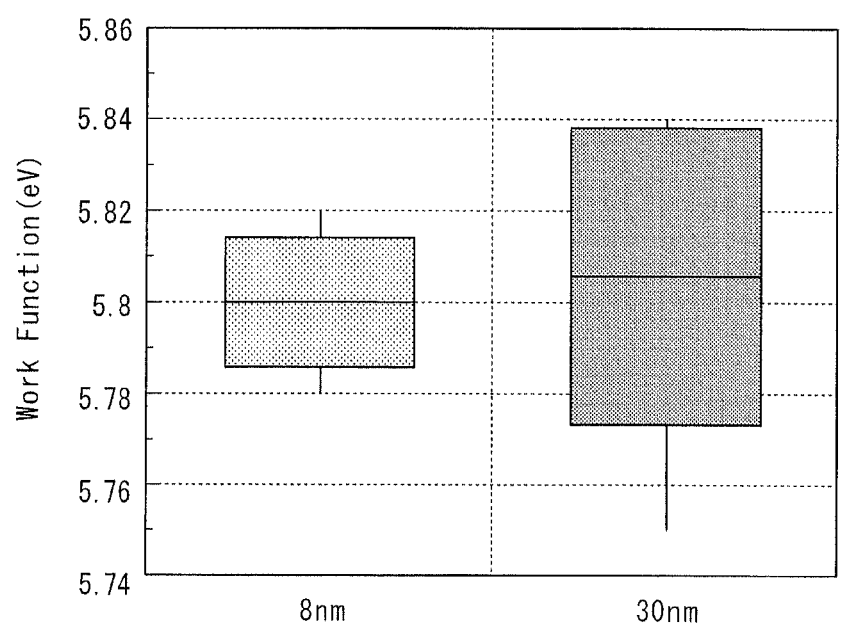
FIG. 15 is a diagram of a work function characteristic of a hole transport layer according to a working example of the present invention.

The light permeability of molybdenum oxide, described above, is shown in FIG. 14. Further, the work function of molybdenum oxide is shown in FIG. 15. As shown in FIG. 14, the average light permeability at an optical wavelength region is 96% for the molybdenum oxide with a film thickness of 8 nm, and 88% for the molybdenum oxide with a film thickness of 30 nm. Moreover, as shown in FIG. 15, the work function is an average of 5.8 eV for the molybdenum oxide with a film thickness of 8 nm, and an average of 5.8 eV for the molybdenum oxide with a film thickness of 30 nm. According to these results, it is determined that the characteristics necessary for the hole transport layer are obtained.

Next, a polyvinyl carbazole derivative is used as an ingredient of the interlayer 105. This ingredient is dissolved into toluene so that the concentration of the polyvinyl carbazole derivative becomes 0.5%. As a result, an ink, which becomes an ingredient of the interlayer 105, is obtained.

Figure 16:
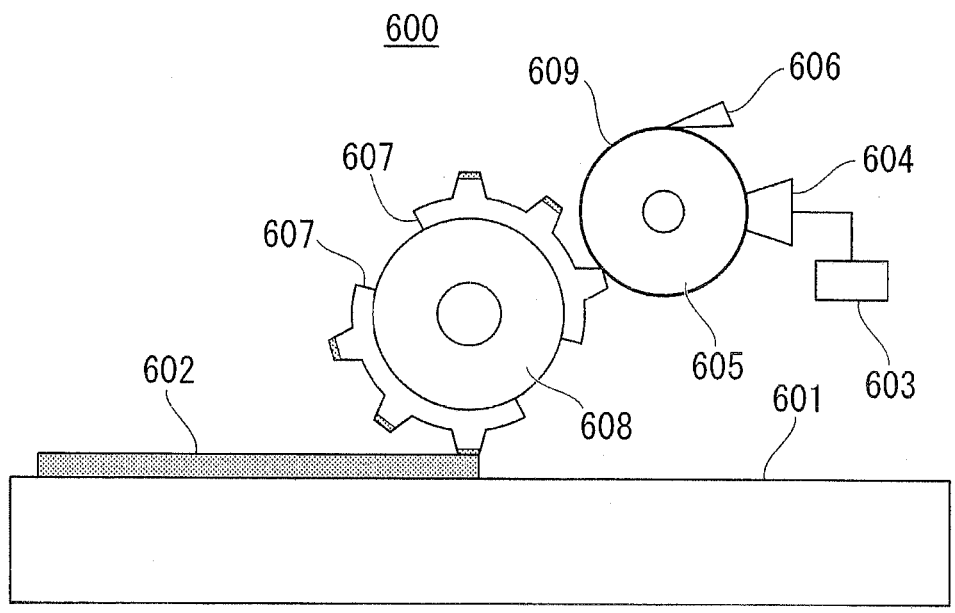
FIG. 16 is a generalized cross sectional diagram of a typography device according to a second embodiment of the present invention.

Next, the substrate 101 is set as a to-be-printed substrate 602 on the typography printing device 600 shown in FIG. 16. The pixel electrode 102, the partition wall 203, and the hole transport layer 104 are formed on the substrate 101.

The typography printing device 600 includes an anilox roll 605, a doctor 606, a relief printing plate 607, and a proof body 608. The relief printing plate 607 is formed with a photosensitive resin. An ink layer 609 is applied to the surface of the anilox roll 605.

A pixel electrode 102 is formed on the to-be-printed substrate 602. The pixel electrode 102 is surrounded by a partition wall 203. A hole transport layer 204 is formed on the pixel electrode 102.

Using the ink described above, the interlayer 105 was printed on the hole transport layer 204 using a typography printing method so that a matching is made with the line pattern of the pixel electrode. According to such a typography printing method, a relief printing plate 607 and an anilox roll 605 with 300 lines/inch were used. The film thickness of the interlayer 105 after the ink was printed and after the ink was dried was 20 nm.

Next, a polyphenylene vinylene derivative is used as an organic luminescent ingredient of the organic luminescent layer 106. This ingredient is dissolved into toluene so that the concentration of this ingredient becomes 1%. In this way, an organic luminescent ink, which becomes an ingredient of the organic luminescent layer 106, is obtained.

Next, the substrate 101 is set as a to-be-printed substrate 602 on the typography printing device 600 shown in FIG. 16. The pixel electrode 102, the partition wall 203, the hole transport layer 104, and the interlayer 105 are formed on the substrate 101.

An interlayer 205 surrounded by a partition wall 203 is formed on the to-be-printed substrate 602.

Using the organic luminescent ink described above, the organic luminescent layer 106 was printed on the interlayer 205 using a typography printing method so that a matching is made with the line pattern of the interlayer 205. According to such a typography printing method, a relief printing plate 607 and an anilox roll 605 with 150 lines/inch were used. The film thickness of the organic luminescent layer 106 after the ink was printed and after the ink was dried was 80 nm.

Next, using the vacuum vapor deposition method, a calcium film was formed as a second electrode (opposing electrode) 107 for a film thickness of 5 nm on the organic luminescent layer 106. A metal mask with an opening of 116 mm×87 mm was used to form the calcium film. Thereafter, using the vacuum vapor deposition method, an aluminum film was formed for a film thickness of 200 nm on the calcium film. A metal mask with an opening of 120 mm×90 mm was used to form the aluminum film.

Thereafter, a glass substrate is prepared as a sealing body 208. The central portion of the sealing body 208 is processed to be a recessed shape. The sealing body 208 is welded to the active matrix substrate 110 so that a second electrode (negative electrode) 107 is placed inside the recessed portion of the sealing body. Further, a moisture absorbing agent is provided on a recessed portion of the glass substrate (sealing body 208) in order to prevent a decline in quality due to an entrance of water or oxygen.

Figure 17:
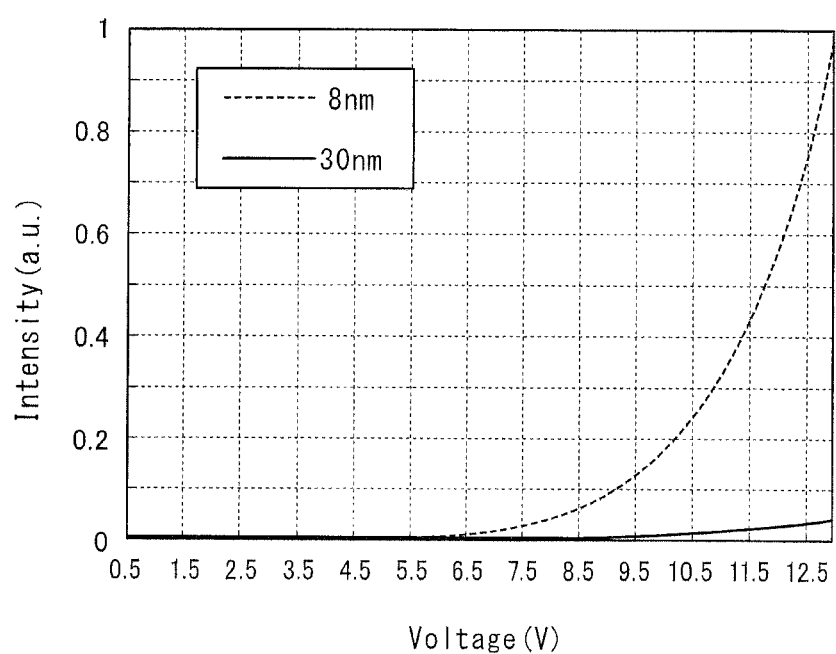
FIG. 17 is a diagram of an electric voltage-emission intensity characteristic of an organic EL element according to a working example of the present invention.

When an organic electroluminescent display device 200, obtained in this way, is driven, a brightness characteristic (intensity) shown in FIG. 17 is achieved. FIG. 17 shows an electric voltage-luminescent brightness characteristic (intensity) when an electric voltage of 0.5 V to 13 V is applied. As shown in FIG. 17, a higher brightness (intensity) was obtained in a display device using an active matrix substrate having a film thickness of molybdenum oxide of 8 nm (Sample 1), compared to a display device using an active matrix substrate having a film thickness of molybdenum oxide of 30 nm (Sample 2).

Figure 18:
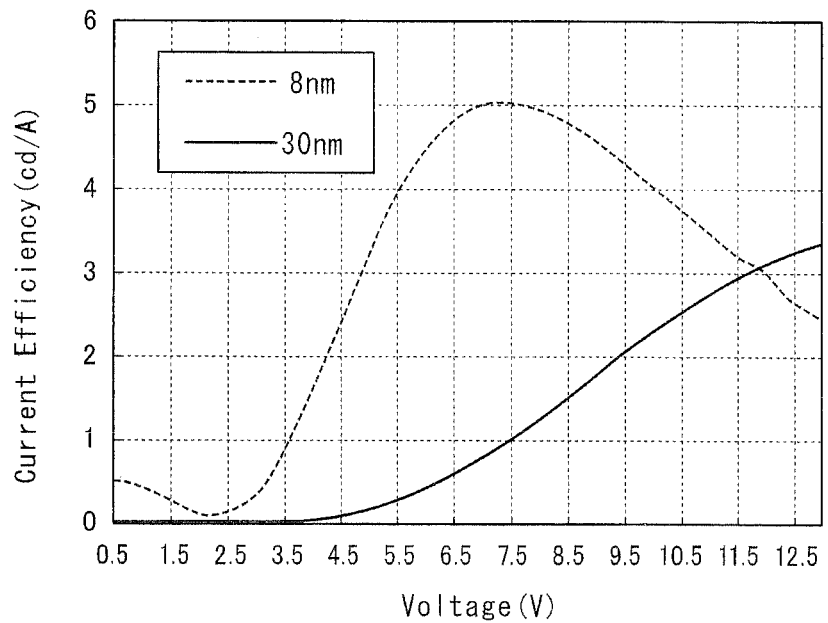
FIG. 18 is a diagram of an electric voltage-current efficiency characteristic of an organic EL element according to a working example of the present invention.

Furthermore, FIG. 18 shows an electric voltage-current efficiency when an electric voltage of 0.5 V to 13 V is applied. As shown in FIG. 18, when the electric voltage is 7 V, a current efficiency of 1 cd/A is achieved for an active matrix substrate having a film thickness of molybdenum oxide of 30 nm (Sample 2). Meanwhile, a current efficiency of 5 cd/A is achieved for an active matrix substrate having a film thickness of molybdenum oxide of 8 nm (Sample 1). Therefore, the current efficiency of Sample 1 is higher than the current efficiency of Sample 2.

Figure 19:
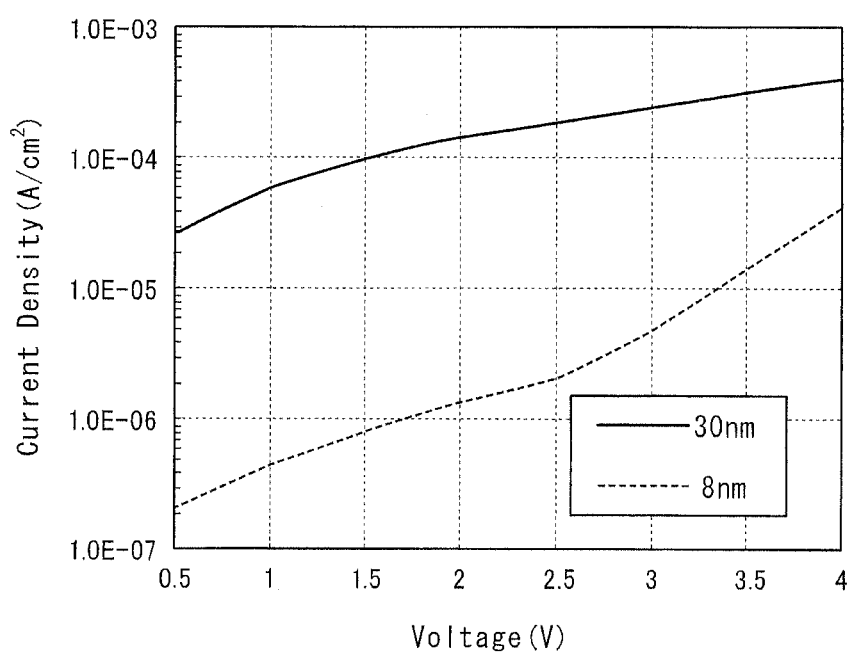
FIG. 19 is a diagram of an electric voltage-current density characteristic of an organic EL element according to a working example of the present invention.
Figure 20A:
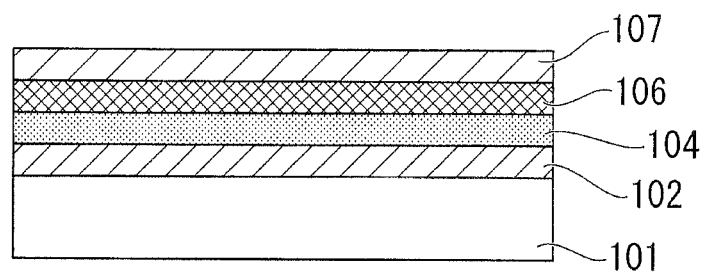
FIG. 20A is a cross sectional diagram showing a general organic electroluminescent element and a luminescent display device.
Figure 20B:
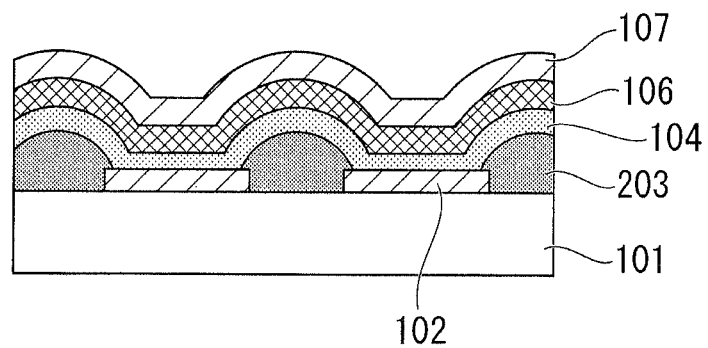
FIG. 20B is a cross sectional diagram showing a general organic electroluminescent element and a luminescent display device.

FIG. 19 shows an electric current before the electric voltage when the illumination begins. As shown in FIG. 19, in the case of an active matrix substrate having a film thickness of molybdenum oxide of 30 nm (Sample 2), a large amount of electric current is running before the illumination begins. Further, it was observed that a leak current, which does not contribute to the illuminating phenomenon, was running. Meanwhile, in the case of an active matrix substrate having a film thickness of molybdenum oxide of 8 nm (Sample 1), the amount of electric current running is restrained before the illumination begins.

A discontinuous island-like thin film is used as the hole transport layer. As a result, the carrier transportability in the film surface direction could be made lower than the carrier transportability in the film thickness direction. Thus, it is possible to prevent the carrier, injected from the pixel electrode 102, from becoming an electric current that does not contribute to the illumination phenomenon.

REFERENCE

Next, as a film formation method of a reference example of an organic luminescent medium layer, a comparative example using a dry film formation method is described. In the reference example, an organic luminescent medium layer is formed in a similar manner as the second embodiment. However, as a film formation method of the organic luminescent medium layer, a dry film formation method using a vacuum vapor deposition method was used.

Further, in Working Example 4, a polyvinyl carbazole derivative is used as the interlayer. However, in the referenced example, instead of this ingredient, CuPc (copper phthalocyanine) is selected. A resisted heating vapor deposition method is used as the film formation method of CuPc. The degree of vacuum during the vapor deposition is $3.0 \times 10^{-4}$ to $5.0 \times 10^{-4}$. By monitoring a measuring device using a crystal oscillator placed inside the vapor deposition chamber, the thickness of the film was controlled. Thus, a CuPc film with a film thickness of 20 nm was formed at a vapor deposition speed of 1.5 to 2.0 Å/sec.

Further, in Working Example 4, a polyphenylene vinylene derivative is used as the organic luminescent layer. However, in the referenced example, instead of this ingredient, an $Alq_3$ (aluminum quinolinol complex) is selected. $Alq_3$ is generally known as a low molecular ingredient. The film of this low molecular ingredient is formed using a resistance heating vapor deposition method. The degree of vacuum during the vapor deposition is $2.0 \times 10^{-4}$ to $4.0 \times 10^{-4}$. An organic luminescent layer with a film thickness of 60 nm was formed at a vapor deposition speed of 3.0 to 4.0 Å/sec.

Next, as a negative electrode, a film of LiF (lithium fluoride) with a film thickness of 2 nm is formed on the organic luminescent layer formed by the low molecular ingredient. Further, as a protection film, a film of Al having a film thickness of 150 nm was formed. The sealing process was performed similar to Working Example 4.

When an organic EL display device formed in this way according to Comparative Example 3 was driven, a plurality of pixel defects were observed. When a film formation method using a vapor deposition method is applied, the organic luminescent layer is formed along a surface shape of the hole transport layer formed below the organic luminescent layer. In particular, the organic luminescent layer is formed along a recessed and projected shape formed on the surface of the hole transport layer having a plurality of discontinuous island-parts. Therefore, the organic luminescent layer includes a portion having a large film thickness and a portion having a small film thickness. According to an organic luminescent layer formed in this way, a high electric voltage is applied locally to a portion having a small film thickness. As a result, a large amount of load is applied. Therefore, a short circuit (connection) is formed between a layer formed on the organic luminescent layer and a layer formed below the organic luminescent layer. Consequently, it is believed that a pixel defect occurred.

As described above in detail, according to an organic EL display device, such that a predetermined luminescent medium layer is formed on the entire display region including a partition wall partitioning a pixel, the present invention may be effectively applied to an organic EL device and a method for manufacturing an organic EL device, which can be easily manufactured and which can reduce or restrain a leak current. In addition, the present invention may be effectively applied to an organic electroluminescent element, an image display device, and a method for manufacturing an image display device, such that a leak current is reduced in the film surface direction of the hole transport layer, and element characteristics are enhanced.

What is claimed is:

1. An organic electroluminescent device comprising:
a substrate;
a first electrode formed on the substrate and comprising a pixel region;
a partition wall formed on the substrate, partitioning the first electrode, and comprising a surface with a recessed and projected surface form;
a luminescent medium layer formed on the pixel region and the partition wall, a film thickness of the partition wall being uneven according to the recessed and projected form, the luminescent medium layer being partially severed according to the recessed and projected form; and
a second electrode formed on the luminescent medium layer, wherein
the recessed and projected surface form is formed over substantially all surface portions of the partition wall at which the partition wall and the luminescent medium layer contact each other,
a calculated average roughness Ra of the recessed and projected surface form is greater than or equal to 1 nm and less than or equal to 200 nm,
an average interval between protected portions of a surface of the recessed and projected surface form is greater than or equal to 5 nm and less than or equal to 100 nm, and
the recessed and projected surface form is configured to increase specific resistance of the luminescent medium layer in a film-surface direction and to restrain a leak current passing through the luminescent medium layer formed on the surface of the partition wall.

2. The organic electroluminescent device according to claim 1, wherein the luminescent medium layer formed on the partition wall is a hole transport layer.

3. The organic electroluminescent device according to claim 2, wherein the hole transport layer is an inorganic compound.

4. The organic electroluminescent device according to claim 3, wherein the inorganic compound comprises one or more types of transition metal.

5. The organic electroluminescent device according to claim 4, wherein the inorganic compound is an oxide, a nitride, or a sulfide.

6. The organic electroluminescent device according to claim 3, 4, or 5, wherein a film thickness of the inorganic compound is greater than or equal to 1 nm and less than or equal to 50 nm.

7. The organic electroluminescent device according to claim 1, wherein the luminescent medium layer formed on the partition wall is a recessed and projected film formed according to the recessed and projected form.

* * * * *